US008045723B2

(12) United States Patent
Kobayashi et al.

(10) Patent No.: US 8,045,723 B2
(45) Date of Patent: Oct. 25, 2011

(54) ACTIVE SOUND EFFECT GENERATING APPARATUS

(75) Inventors: Yasunori Kobayashi, Utsunomiya (JP); Toshio Inoue, Tochig-ken (JP); Akira Takahashi, Tochigi-ken (JP); Kosuke Sakamoto, Utsunomiya (JP)

(73) Assignee: Honda Motor Co., Ltd., Tokyo (JP)

( * ) Notice: Subject to any disclaimer, the term of this patent is extended or adjusted under 35 U.S.C. 154(b) by 748 days.

(21) Appl. No.: 12/175,011

(22) Filed: Jul. 17, 2008

(65) Prior Publication Data

US 2009/0028353 A1 Jan. 29, 2009

(30) Foreign Application Priority Data

Jul. 25, 2007 (JP) ................................ 2007-193522

(51) Int. Cl.
*H03B 29/00* (2006.01)

(52) U.S. Cl. ............................ 381/61; 381/86; 381/71.1

(58) Field of Classification Search .................... 381/86, 381/61, 71.1
See application file for complete search history.

(56) References Cited

U.S. PATENT DOCUMENTS 5,835,605 A * 11/1998 Kunimoto ........................ 381/61
7,079,933 B2 7/2006 Kano et al.
7,164,117 B2 * 1/2007 Breed et al. .................... 250/221
7,663,502 B2 * 2/2010 Breed ......................... 340/12.25
7,773,760 B2 * 8/2010 Sakamoto et al. ........... 381/71.9
7,876,910 B2 * 1/2011 Sakamoto et al. ........... 381/71.4
7,876,913 B2 * 1/2011 Kobayashi et al. ............. 381/86
2005/0046584 A1 * 3/2005 Breed ....................... 340/825.72
2005/0201570 A1 9/2005 Honji
2006/0208169 A1 * 9/2006 Breed et al. .................... 250/221
2006/0215846 A1 * 9/2006 Kobayashi et al. ............. 381/61
2006/0269078 A1 * 11/2006 Sakamoto et al. ........... 381/71.1
2007/0140503 A1 * 6/2007 Sakamoto et al. ........... 381/71.4
2007/0223727 A1 * 9/2007 Kobayashi et al. ............. 381/86
2007/0223728 A1 * 9/2007 Sakamoto et al. .............. 381/86
2007/0230716 A1 * 10/2007 Kobayashi et al. ............. 381/86
2007/0234879 A1 * 10/2007 Kobayashi et al. ............. 84/600
2008/0172155 A1 7/2008 Takamatsu et al.
2008/0192954 A1 * 8/2008 Honji et al. ...................... 381/86
2008/0292110 A1 * 11/2008 Kobayashi et al. .......... 381/71.4
2008/0310642 A1 * 12/2008 Sakamoto et al. .............. 381/61
2009/0028353 A1 * 1/2009 Kobayashi et al. ............. 381/61
2009/0060217 A1 * 3/2009 Sakamoto et al. ........... 381/71.4

FOREIGN PATENT DOCUMENTS

JP 54-008027 1/1979
JP 01-140199 A 6/1989
JP 02-158296 A 6/1990
JP 05-131828 A 5/1993
JP 07-032948 A 2/1995
JP 07-108853 A 4/1995
JP 8-152894 A 6/1996
JP 2000-010576 A 1/2000
JP 2004-144221 A 5/2004
JP 2005-289354 A 10/2005
JP 2006-347254 A 12/2006

(Continued)

*Primary Examiner* — Laura M Menz
(74) *Attorney, Agent, or Firm* — Arent Fox LLP

(57) ABSTRACT

An active sound effect generating apparatus includes a controller (a fourth acoustic adjuster and a fifth acoustic adjuster) which determines the amplitude of a control signal by adjusting the amplitudes of reference signals (intermediate signals) depending on an engine rotational frequency change [Hz/second] calculated by an engine rotational frequency change calculator and an accelerator opening [%] detected by an accelerator opening sensor.

8 Claims, 15 Drawing Sheets

FOREIGN PATENT DOCUMENTS

JP 2007256838 A * 10/2007
JP 2007256839 A * 10/2007
JP 2008216783 A * 9/2008
JP 2009031428 A * 2/2009

* cited by examiner

FIG. 7

| ACCELERATOR OPENING Aor [%] | y3 [TIMES] (NORMAL DRIVE MODE) | y3 [TIMES] (SPORTS DRIVE MODE) |
|---|---|---|
| 0 | 0 | 0 |
| 5 | 0.01 | 0.04 |
| 10 | 0.02 | 0.12 |
| 15 | 0.02 | 0.24 |
| 20 | 0.03 | 0.48 |
| 25 | 0.05 | 0.82 |
| 30 | 0.08 | 0.90 |
| 35 | 0.11 | 0.94 |
| 40 | 0.17 | 0.96 |
| 45 | 0.26 | 0.98 |
| 50 | 0.38 | 1 |
| 55 | 0.58 | 1 |
| 60 | 0.86 | 1 |
| 65 | 1 | 1 |
| 70 | 1 | 1 |
| 75 | 1 | 1 |
| 80 | 1 | 1 |
| 85 | 1 | 1 |
| 90 | 1 | 1 |
| 95 | 1 | 1 |
| 100 | 1 | 1 |

75 76

101B

ACTIVE SOUND EFFECT GENERATING APPARATUS

BACKGROUND OF THE INVENTION

1. Field of the Invention

The present invention relates to an active sound effect generating apparatus for generating a sound effect based on the rotational frequency of an engine on a mobile body such as a vehicle or the like.

2. Description of the Related Art

Heretofore, there have been proposed active sound effect generating apparatus (also referred to as "ASC (Active Sound Control) apparatus") for detecting an action made by the driver of a vehicle to accelerate or decelerate the vehicle and generating a sound effect based on the detected level of acceleration or deceleration in the vehicle cabin through a speaker in the vehicle cabin (see Japanese Laid-Open Patent Publication No. 54-008027 and U.S. Patent Application Publication No. 2006/0215846).

According to the proposed ASC apparatus, when the engine rotational speed increases based on an accelerating action, the speaker generates a sound effect having a high frequency and a large sound volume depending on the increase in the engine rotational speed, producing an enhanced staged sound atmosphere in the vehicle cabin.

According to U.S. Patent Application Publication No. 2006/0215846, a preferred sound effect is generated by changing the sound pressure level (gain) depending on a change (Hz/second) in the engine rotational frequency per unit time (hereinafter referred to as "rotational frequency change") (see FIG. 14 of U.S. Patent Application Publication No. 2006/0215846).

The ASC apparatus disclosed in U.S. Patent Application Publication No. 2006/0215846, which changes the sound pressure level depending on the rotational frequency change, may generate an actual sound effect whose sound pressure level is not commensurate with the driver's action on the accelerator pedal, making the driver feel odd about the sound effect. For example, while the vehicle is running uphill, even if the driver presses the accelerator pedal strongly, the rotational frequency does not change greatly because of the increased hill-climbing resistance, and hence the sound pressure level does not increase commensurate with the increase in the depression of the accelerator pedal. Conversely, while the vehicle is running downhill, since the hill-climbing resistance drops, a large sound effect is generated even if the driver presses the accelerator pedal lightly. The above response that does not commensurate with the driver's action may possibly be caused when the vehicle runs not only on slopes but also on different types of roads and under different road conditions.

SUMMARY OF THE INVENTION

It is an object of the present invention to provide an ASC apparatus which is capable of generating sound effects that are more natural to the senses of the driver of a vehicle.

An active sound effect generating apparatus (ASC apparatus) according to the present invention includes a waveform data table for storing one period of waveform data, a rotational frequency detector for detecting the rotational frequency of an engine, a reference signal generator for generating a harmonic reference signal based on the rotational frequency by reading the waveform data successively from the waveform data table, a controller for generating a control signal to generate a sound effect based on the reference signal, an output unit for outputting the sound effect based on the control signal, a rotational frequency change calculator for calculating a rotational frequency change which represents a change per unit time in the rotational frequency, and an engine load detector for detecting a load on the engine, wherein the controller determines the amplitude of the control signal by adjusting the amplitude of the reference signal depending on the rotational frequency change and the load on the engine.

With the above arrangement, the amplitude of the reference signal is adjusted depending on the load on the engine in addition to the rotational frequency change. The load on the engine represents a request of the driver of the vehicle for accelerating or decelerating the vehicle. Therefore, the ASC apparatus is capable of generating a more natural sound effect which meets the request of the driver for accelerating or decelerating the vehicle.

The engine load detector may detect an accelerator opening as representing the load on the engine.

The ASC apparatus should preferably further include drive mode detecting means for detecting drive modes of the vehicle, wherein the controller determines the amplitude of the control signal by adjusting the amplitude of the reference signal depending on the drive mode detected by the drive mode detecting means. Preferably, the controller switches between amplitude adjusting characteristics for the reference signal depending on the drive mode, the amplitude adjusting characteristics being set depending on the load on the engine. The ASC apparatus is now capable of outputting a sound effect depending on the drive mode to provide a more preferable acoustic effect.

The drive mode should preferably include a cruise drive mode for enabling the vehicle to cruise. The cruise drive mode is a drive mode for enabling the vehicle to assist the driver in automatically keeping a constant vehicle speed. In the cruise drive mode, the request of the driver for the generation of a sound effect is considered to be different from the request of the driver in drive modes other than the cruise drive mode. Specifically, in the cruise drive mode, the driver seems to be driving the vehicle simply to move from one place to another, rather than to enjoy driving the vehicle, and hardly wants to have a sound effect produced. Accordingly, the sound effect suitable for the cruise drive mode may be generated or the sound effect may be stopped in the cruise drive mode, and hence generation of sound effect may be controlled more appropriately.

The controller may have amplitude adjusting characteristics with weighted values preset for each value of the load on the engine, and determine the amplitude of the control signal by adjusting the amplitude of the reference signal using the weighted values. With the weighted value preset for each value of the load on the engine, the controller can quickly adjust the amplitude of the reference signal. Furthermore, since the degree of amplitude adjustment can be set for each value of the load on the engine, the sound pressure of the sound effect can be controlled at small intervals.

The controller should preferably switch between amplitude adjusting characteristics for the reference signal depending on the load on the engine, the amplitude adjusting characteristics being set depending on the rotational frequency change. In this manner, an amplitude adjusting characteristic for the reference signal can be set more flexibly than the case where an amplitude adjusting characteristics for the reference signal based on the engine rotational frequency change and an amplitude adjusting characteristic for the reference signal based on the load on the engine are set independently of each other.

The controller should preferably calculate an engine load change which represents a change per unit time in the load on the engine, and make the amplitude of the control signal greater when the engine load change is positive than when the engine load change is negative, even if the load on the engine is equal. Generally, when the engine load change is positive, the driver wants the vehicle to be accelerated quickly, and when the engine load change is negative, the driver wants the vehicle to be decelerated or accelerated slowly. Therefore, the ASC apparatus thus arranged is capable of generating a more natural sound effect.

According to the present invention, the amplitude of the reference signal is adjusted depending on the load on the engine as well as the rotational frequency change. The load on the engine represents a request of the driver of the vehicle for accelerating or decelerating the vehicle. Therefore, the ASC apparatus is capable of generating a more natural sound effect which meets the request of the driver for accelerating or decelerating the vehicle.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 7 is a diagram showing gain characteristics used in a per-engine-load adjusting process according to the first embodiment;

DESCRIPTION OF THE PREFERRED EMBODIMENTS

Figure 1:
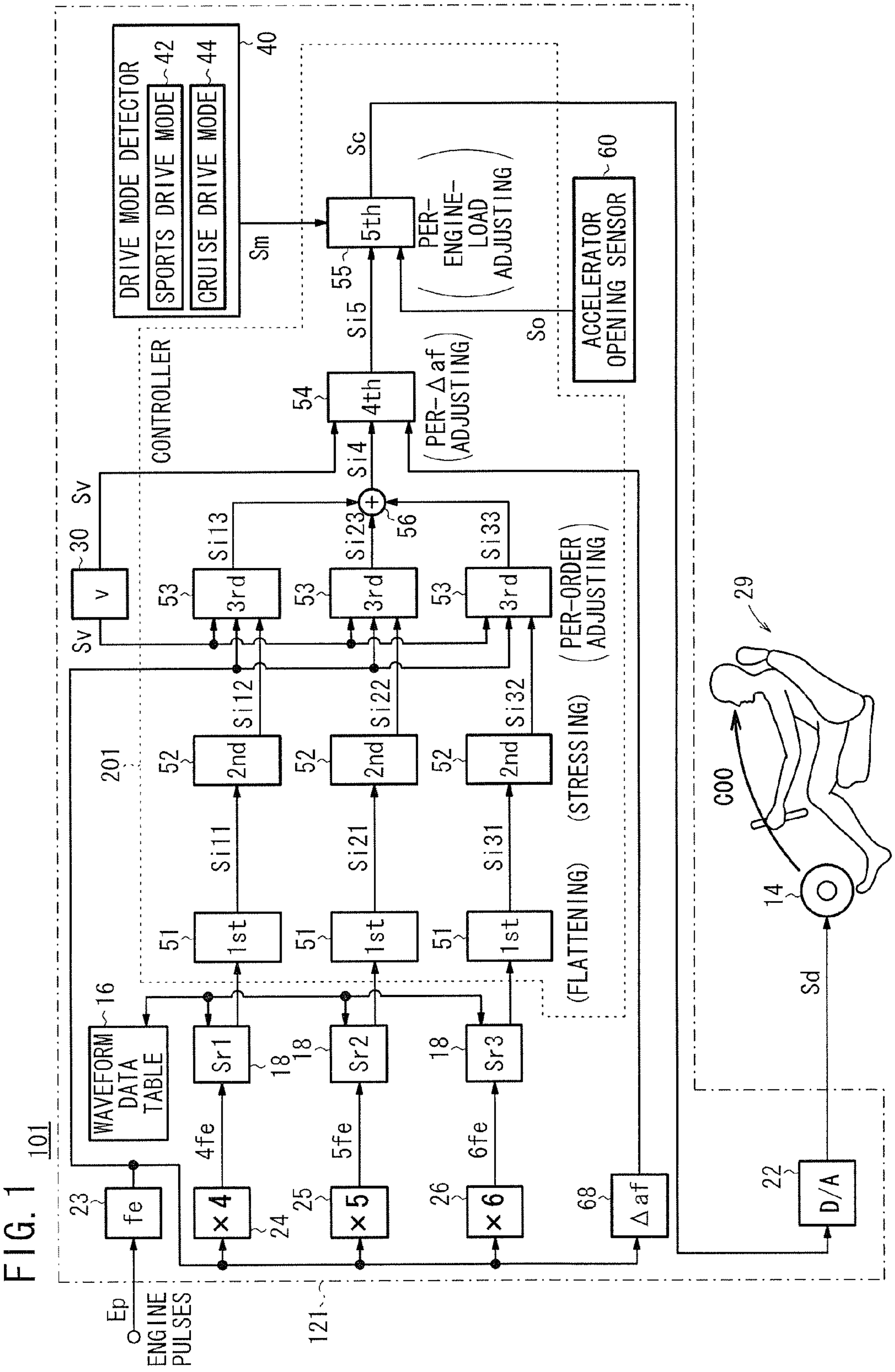
FIG. 1 is a block diagram showing a general functional configuration of an active sound effect generating apparatus according to a first embodiment of the present invention.

Like or corresponding parts are denoted by like or corresponding reference characters.

Embodiments of the present invention will be described in detail below with reference to the drawings.

A. First Embodiment

1. General Scheme for Generating a Sound Effect:

FIG. 1 shows in block form a general functional configuration of an active sound effect generating apparatus 101 (ASC apparatus 101) according to a first embodiment of the present invention.

The ASC apparatus 101, which is designed for use on an automatic transmission vehicle, generates a sound effect based on the rotational frequency of an engine, not shown, mounted on the vehicle to produce a live sound atmosphere in the vehicle cabin during driving. A general scheme for generating the sound effect will be described below.

An engine rotational frequency detector 23 such as a frequency counter or the like detects the frequency (engine rotational frequency fe) [Hz] of an engine pulse Ep that is generated by a sensor such as a Hall device or the like each time the output shaft of the engine makes a revolution. Based on the engine rotational frequency fe detected by the engine rotational frequency detector 23, three multipliers 24, 25, 26 which serve as frequency converters generate respective harmonic signals 4*fe*, 5*fe*, 6*fe* which are frequency signals having higher frequencies. Then, three reference signal generators 18 generate respective reference signals Sr1, Sr2, Sr3 based on the harmonic signals 4*fe*, 5*fe*, 6*fe* and waveform data stored in a waveform data table 16. A controller 201 processes the reference signals Sr1, Sr2, Sr3 into a single control signal Sc. A digital-to-analog converter (D/A converter) 22 converts the control signal Sc into an analog control signal Sd. A speaker 14 generates and outputs a sound effect based on the control signal Sd. Though not shown, an output amplifier is connected between the D/A converter 22 and the speaker 14, and the gain of the output amplifier can be changed by an occupant of the vehicle.

In the present embodiment, an engine rotational frequency change calculator 68 calculates an engine rotational frequency change Δaf [Hz/second], which represents a change per unit time of the engine rotational frequency fe. The engine rotational frequency change ≠af is output from the engine rotational frequency change calculator 68 to the controller 201, which uses the engine rotational frequency change Δaf in generating the control signal Sc.

The engine rotational frequency fe [Hz] is multiplied 60 times into an engine rotational speed Ne [rpm], and the engine rotational frequency change Δaf [Hz/second] is multiplied 60 times into an engine rotational speed change ΔNe [rpm/second]. In the present description and the accompanying drawings, the engine rotational speed Ne and the engine rotational speed change ΔNe may be referred to instead of the engine rotational frequency fe and the engine rotational frequency change Δaf, respectively.

Furthermore, in this embodiment, the engine rotational frequency fe detected by the engine rotational frequency detector 23, a vehicle speed v [km/hour] detected by a vehicle speed sensor 30, an accelerator opening Aor [%] detected by an accelerator opening sensor 60, and a drive mode DM detected by a drive mode detecting means 40 are output to the controller 201, which uses the engine rotational frequency fe, the vehicle speed v, the accelerator opening Aor, and the drive mode DM in generating the control signal Sc.

The engine rotational frequency detector 23, the multipliers 24, 25, 26, the reference signal generator 18, the waveform data table 16, the controller 201, the D/A converter 22, the engine rotational frequency change calculator 68, the vehicle speed sensor 30, accelerator opening sensor 60, and the drive mode detecting means 40 are placed in the dashboard of the vehicle, and make up an ECU (Electric Control Unit) 121 serving as a general controller.

The speaker 14 serves to let a passenger in a passenger's position 29 such as a driver's seat or a front passenger's seat hear sounds output therefrom. The speaker 14 may be fixedly disposed on a front door panel on each side of the vehicle, on a kick panel on each side of the vehicle (an inner panel near a front door on each side of a front leg space), or beneath the central port of the dashboard.

2. Harmonic Signals 4*fe*, 5*fe*, 6*fe* (the multipliers 24, 25, 26):

As described above, the multipliers 24, 25, 26 generate respective harmonic signals 4*fe*, 5*fe*, 6*fe* which are frequency signals having higher frequencies based on the engine rotational frequency fe detected by the engine rotational frequency detector 23. Specifically, the harmonic signals 4*fe*, 5*fe*, 6*fe* represent fourth, fifth, and sixth harmonics of the engine rotational frequency fe as a fundamental frequency. The multipliers 24, 25, 26 may multiply the engine rotational frequency fe by other integers such as 2, 3, 7, 8, 9, . . . or real numbers such as 2.5, 3.3, . . . .

In the present embodiment, the three multipliers 24, 25, 26 are connected to the engine rotational frequency detector 23 in parallel relationship to each other. The number of multipliers used may be varied, or the multipliers may be dispensed with.

3. Reference Signals Sr1, Sr2, Sr3 (the Reference Signal Generator 18 and the Waveform Data Table 16):

As described above, the reference signal generators 18 generate respective reference signals Sr1, Sr2, Sr3 based on the harmonic signals 4*fe*, 5*fe*, 6*fe* and waveform data stored in the waveform data table 16. The reference signals Sr1, Sr2, Sr3 may be generated according to the technology disclosed in U.S. Patent Application Publication No. 2006/0215846, paragraphs [0066] through [0068], [0085], [0086], etc.

4. Control Signal Sc (the Controller 201):

As shown in FIG. 1, the controller 201 which acoustically changes the reference signals Sr1, Sr2, Sr3 into the control signal Sc includes first acoustic adjusters 51, second acoustic adjusters 52, third acoustic adjusters 53, a fourth acoustic adjuster 54, and a fifth acoustic adjuster 55, each serving as an acoustic adjusting means.

The first acoustic adjusters 51 perform a "sound field adjusting process" (also referred to as "flattening process"). The sound field adjusting process may be a process disclosed in U.S. Patent Application Publication No. 2006/0215846, paragraphs [0069] through [0076], [0099] through [0103], [0121], etc. After the first acoustic adjusters 51 have performed the sound field adjusting process on the reference signals Sr1, Sr2, Sr3, the first acoustic adjusters 51 send respective intermediate signals Si11, Si21, Si31 to the second acoustic adjusters 52.

The second acoustic adjusters 52 perform a "frequency stressing process". The frequency stressing process may be a process disclosed in U.S. Patent Application Publication No. 2006/0215846, paragraphs [0079] through [0082], [0121], etc. After the second acoustic adjusters 52 have performed the frequency stressing process on the intermediate signals Si11, Si21, Si31, the second acoustic adjusters 52 send respective intermediate signals Si12, Si22, Si32 to the third acoustic adjusters 53.

The third acoustic adjusters 53 perform a "per-order adjusting process" to be described later. The fourth acoustic adjuster 54 performs a "per-rotational-frequency-change adjusting process" to be described later. The fifth acoustic adjuster 55 performs a "per-engine-load adjusting process" to be described later.

Figure 2:
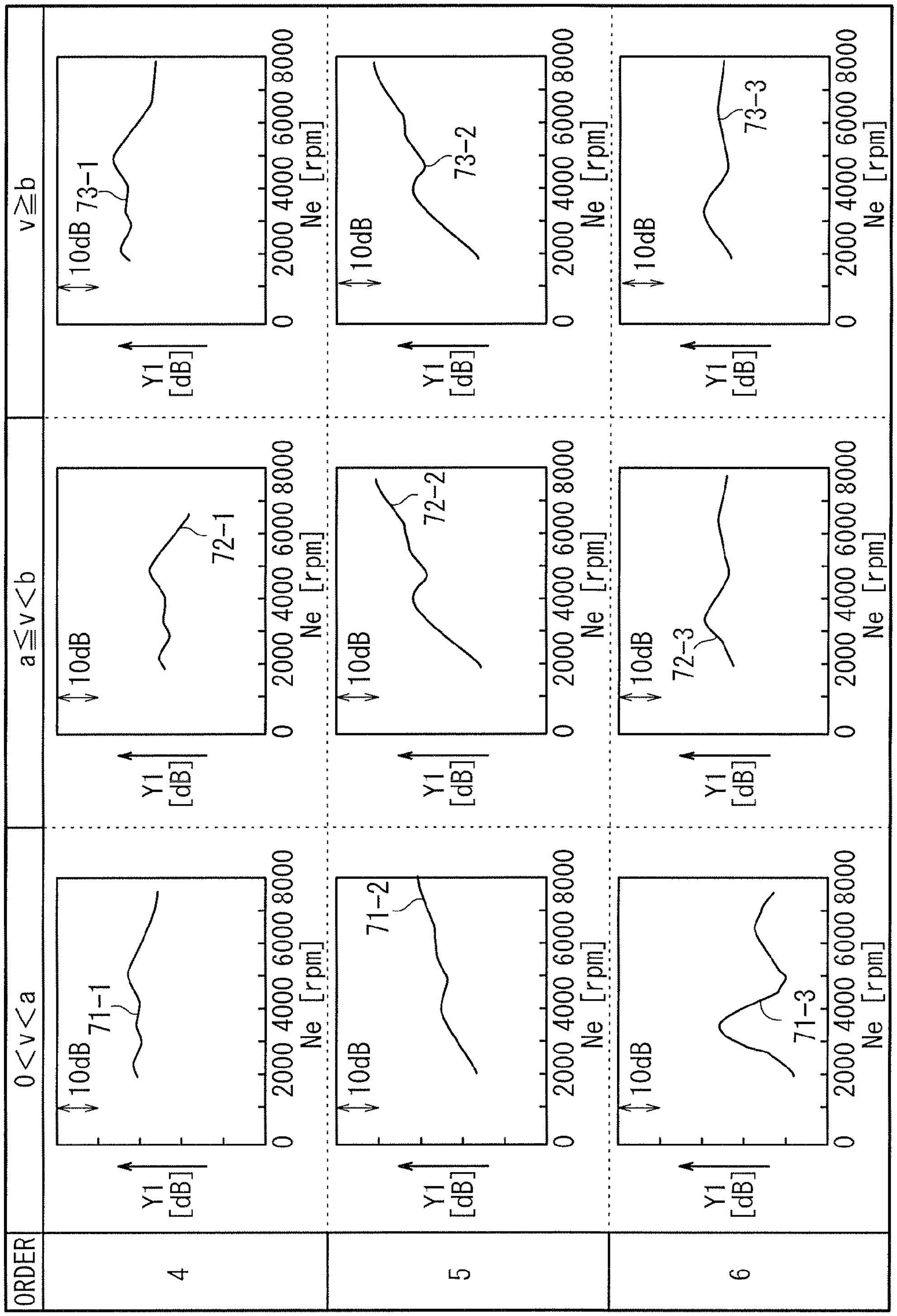
FIG. 2 is a diagram showing gain characteristics used in a per-order adjusting process according to the first embodiment.

(a) Per-order Adjusting Process:

(i) Details of the Per-Order Adjusting Process:

The per-order adjusting process is based on a process disclosed in U.S. Patent Application Publication No. 2006/0215846, paragraphs [0088], [0122], etc., and adjusts the intermediate signals Si12, Si22, Si32 depending on the vehicle speed signal Sv representative of the vehicle speed v which is sent from the vehicle speed sensor 30. As shown in FIG. 2, in the per-order adjusting process, a gain characteristic (a gain Y1 [dB] used for the intermediate signals Si12, Si22, Si32) varies depending on the vehicle speed v [km/hour], in addition to varying orders. Specifically, when the vehicle speed v is in the range of $0 < v < a$ (e.g., a=40), a gain characteristic 71-1 is used for the fourth reference signal Sr1, a gain characteristic 71-2 for the fifth reference signal Sr2, and a gain characteristic 71-3 for the sixth reference signal Sr3. When the vehicle speed v is in the range of $a \leqq v < b$ (e.g., b=60), a gain characteristic 72-1 is used for the fourth reference signal Sr1, a gain characteristic 72-2 for the fifth reference signal Sr2, and a gain characteristic 72-3 for the sixth reference signal Sr3. When the vehicle speed v is in the range of $v \geqq b$, a gain characteristic 73-1 is used for the fourth reference signal Sr1, a gain characteristic 73-2 for the fifth reference signal Sr2, and a gain characteristic 73-3 for the sixth reference signal Sr3.

When the vehicle speed v is v=0, respective gain characteristics which are 10 dB lower than the gain characteristics 71-1, 71-2, 71-3 are used. When a vehicle speed change Δav [km/hour/second] calculated based on the vehicle speed v by the third acoustic adjusters 53 is smaller than a given threshold X1 (e.g., X1=5), the gain characteristics 71-1, 71-2, 71-3, 72-1, 72-2, 72-3, 73-1, 73-2, 73-3 are lowered 6 dB at maximum, using a gain characteristic similar to a gain characteristic E shown in FIG. 5 to be described later.

After the third acoustic adjusters 53 have performed the per-order adjusting process on the intermediate signals Si12, Si22, Si32, the third acoustic adjusters 53 send respective intermediate signals Si13, Si23, Si33 to an adder 56.

Figure 3:
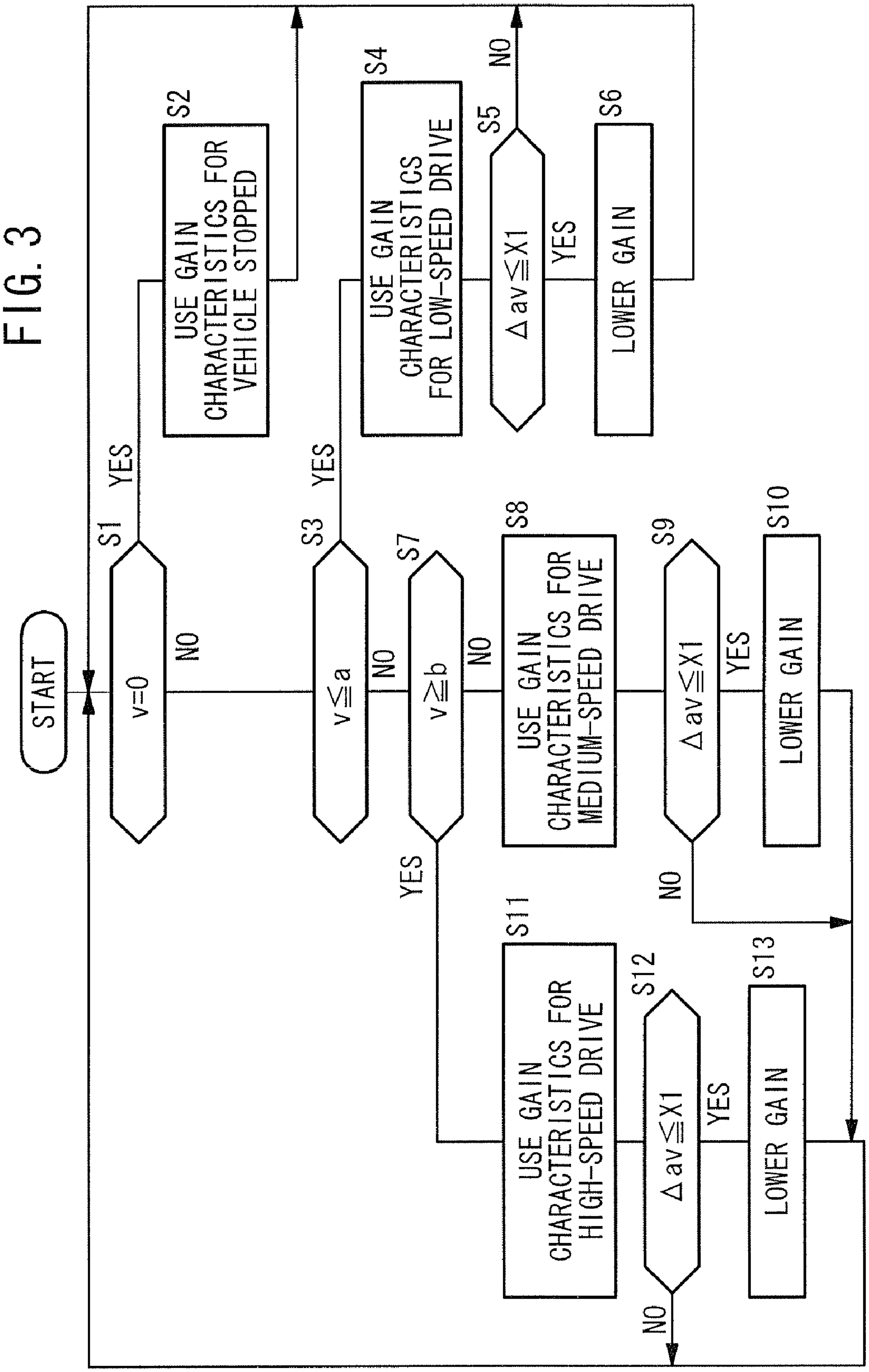
FIG. 3 is a flowchart of a sequence for determining gain characteristics in the per-order adjusting process according to the first embodiment.

(ii) Sequence of the Per-Order Adjusting Process:

FIG. 3 is a flowchart of a sequence for determining gain characteristics in the per-order adjusting process according to the first embodiment.

As shown in FIG. 3, when a battery, not shown, is connected to the ECU 121, the third acoustic adjusters 53 (the controller 201) determine whether the vehicle speed v is 0 km/hour or not, i.e., whether the vehicle is running or not, based on the vehicle speed signal Sv from the vehicle speed sensor 30, in step S1. If the vehicle speed v is 0 km/hour, then the third acoustic adjusters 53 judge that the vehicle is at rest, and performs the per-order adjusting process using the respective gain characteristics which are 10 dB lower than the gain characteristics 71-1, 71-2, 71-3 in step S2.

If the vehicle speed v is not 0 km/hour in step S1, then the third acoustic adjusters 53 determine whether or not the vehicle speed v is a km/hour (e.g., a=40) or lower ($v \leqq a$) in step S3. If $v \leqq a$, then the third acoustic adjusters 53 judge that the vehicle is running at a low speed, and perform the per-order adjusting process using the gain characteristics 71-1, 71-2, 71-3 shown in FIG. 2 in step S4.

In step S5, the third acoustic adjusters 53 determine whether or not the vehicle speed change Δav [km/hour/second] is of a given value X1 (e.g., X1=5) or smaller. If the vehicle speed change Δav is not of the given value X1 or smaller, then the third acoustic adjusters 53 use the gain characteristics 71-1, 71-2, 71-3 as they are. If the vehicle speed change Δav is of the given value X1 or smaller, then the third acoustic adjusters 53 lower the respective gain characteristics 71-1, 71-2, 71-3 by 6 dB in step S6.

If the vehicle speed v is higher than a km/hour in step S3, then the third acoustic adjusters 53 determine whether or not the vehicle speed v is b km/hour (e.g., b=60) or higher in step S7. If the vehicle speed v is lower than b km/hour, then the third acoustic adjusters 53 judge that the vehicle is running at a medium speed, and perform the per-order adjusting process using the gain characteristics 72-1, 72-2, 72-3 shown in FIG. 2 in step S8.

In step S9, the third acoustic adjusters 53 determine whether or not the vehicle speed change Δav is of the given value X1 or smaller. If the vehicle speed change Δav is not of the given value X1 or smaller, then the third acoustic adjusters 53 use the gain characteristics 71-1, 71-2, 71-3 as they are. If the vehicle speed change Δav is of the given value X1 or smaller, then the third acoustic adjusters 53 lower the respective gain characteristics 72-1, 72-2, 72-3 by 6 dB in step S10.

If the vehicle speed v is equal to or higher than b km/hour in step S7, then the third acoustic adjusters 53 judge that the vehicle is running at a high speed, and perform the per-order adjusting process using the gain characteristics 73-1, 73-2, 73-3 shown in FIG. 2 in step S11.

In step S12, the third acoustic adjusters 53 determine whether or not the vehicle speed change Δav is of the given value X1 or smaller. If the vehicle speed change Δav is not of the given value X1 or smaller, then the third acoustic adjusters 53 use the gain characteristics 73-1, 73-2, 73-3 as they are. If the vehicle speed change Δav is of the given value X1 or smaller, then the third acoustic adjusters 53 lower the respective gain characteristics 73-1, 73-2, 73-3 by 6 dB in step S13.

After having specified the gain characteristics in step S2, S5, S6, S9, S10, S12 or S13, the third acoustic adjusters 53 go back to step S1. The third acoustic adjusters 53 repeat steps S1 through S13 until the engine on the vehicle is shut off.

(b) Per-rotational-frequency-change Adjusting Process:

(i) Basics of the Per-rotational-frequency-change Adjusting Process:

The per-rotational-frequency-change adjusting process (hereinafter also referred to as "per-Δaf adjusting process") varies a gain Y2 [dB] for amplifying an intermediate signal Si4, which the adder 56 generates by combining the intermediate signals Si13, Si23, Si33 (FIG. 1) output from the third acoustic adjuster 53, based on the engine rotational frequency change Δaf to adjust the sound pressure level of a sound effect output from the speaker 14.

Figure 4:
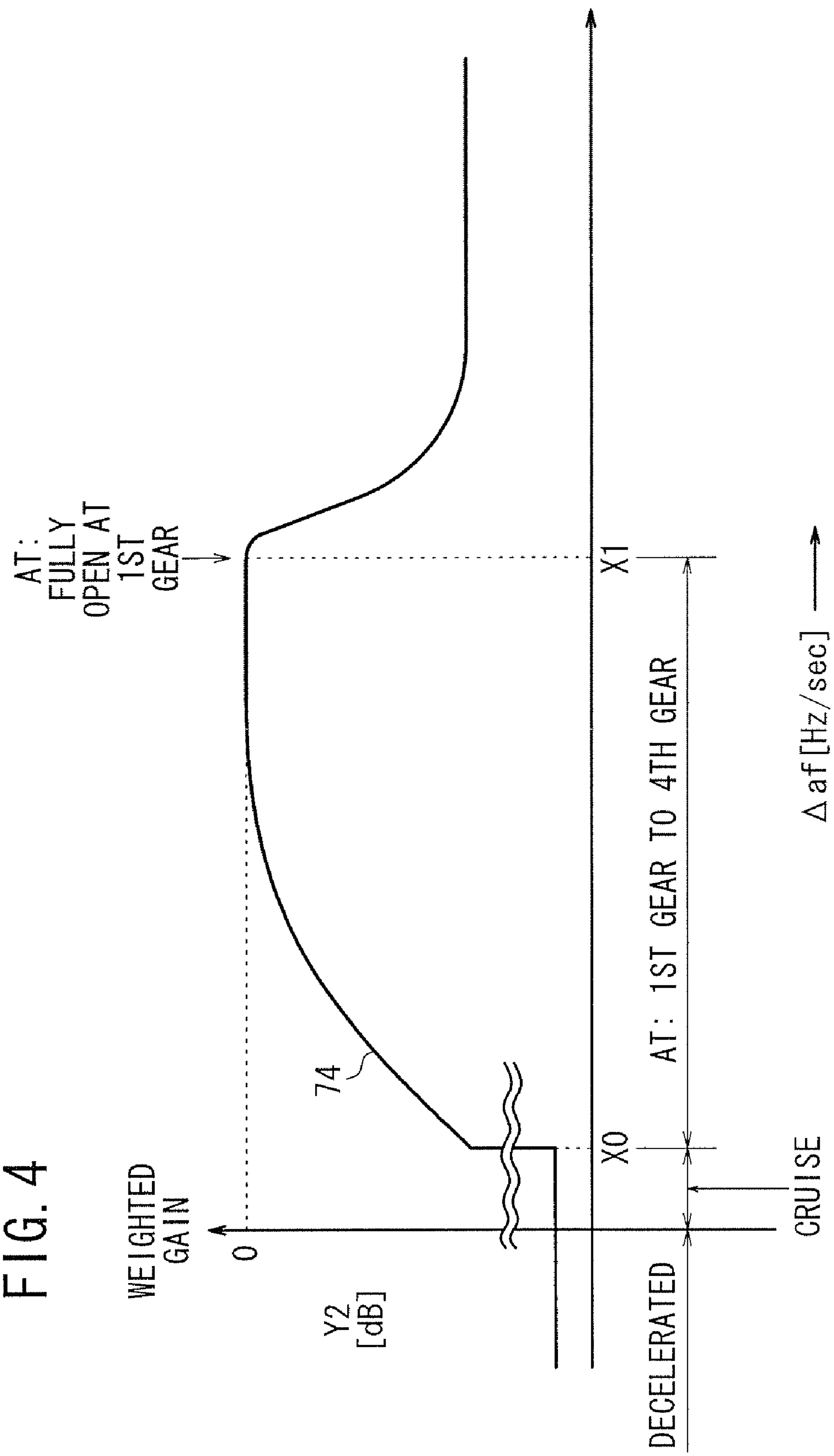
FIG. 4 is a diagram showing reference gain characteristics used in a per-rotational-frequency-change adjusting process according to the first embodiment.

In the per-Δaf adjusting process according to the present embodiment, as shown in FIG. 4, a gain characteristic 74 defining the relationship between the gain Y2 and the engine rotational frequency change Δaf is used as a reference gain characteristic. The gain characteristic 74 is the same as the gain characteristic disclosed in U.S. Patent Application Publication No. 2006/0215846, paragraphs [0107] through [0114], etc.

After having performed the per-Δaf adjusting process on the intermediate signal Si4, the fourth acoustic adjuster 54 sends an intermediate signal Si5 to the fifth acoustic adjuster 55.

(ii) Switching Between Gain Characteristics Depending on the Vehicle Speed v and the Vehicle Speed Change Δav:

The per-Δaf adjusting process according to the present embodiment switches between gain characteristics depending on the vehicle speed v [km/hour] and the vehicle speed change Δav [km/hour/second]. The vehicle speed change Δav is calculated by the fourth acoustic adjuster 54 based on the vehicle speed signal Sv from the vehicle speed sensor 30.

Figure 5:
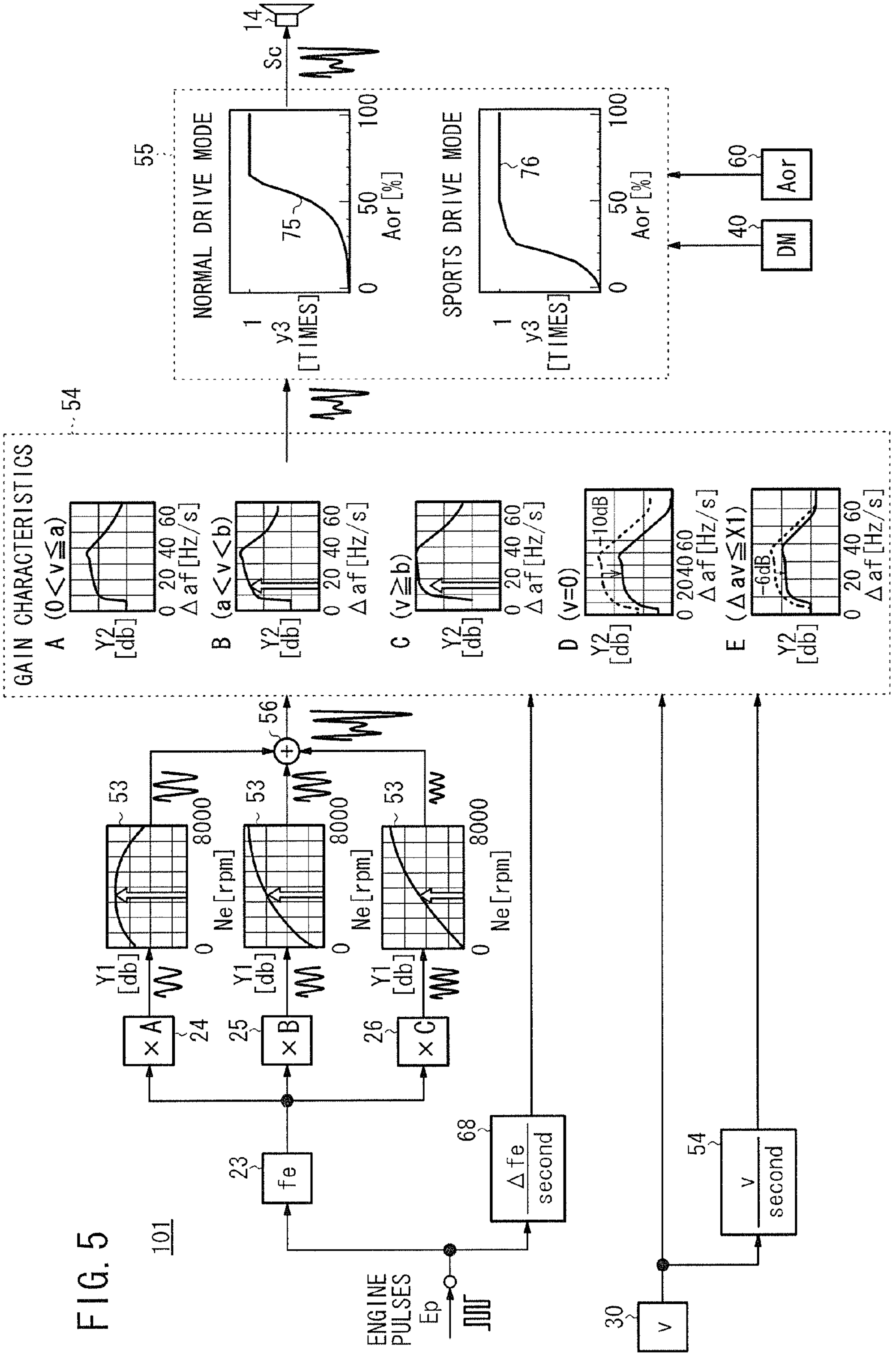
FIG. 5 is a conceptual diagram illustrative of a process of switching between amplitude adjusting characteristics according to the first embodiment.

FIG. 5 is a conceptual diagram illustrative of a process of switching between gain characteristics. Those parts shown in FIG. 5 which are identical to those shown in FIG. 1 are denoted by identical reference characters. Some components including the reference signal generators 18, the waveform data table 16, the first acoustic adjusters 51, and the second acoustic adjusters 52, etc. are omitted from illustration in FIG. 5.

One of gain characteristics A through D shown in the fourth acoustic adjuster 54 is selected depending on the vehicle speed v. Specifically, the gain characteristic A is used when the vehicle speed v is in the range of $0<v \leqq a$ [km/hour], the gain characteristic B is used when the vehicle speed v is in the range of $a<v<b$ [km/hour], the gain characteristic C is used when the vehicle speed v is in the range of $b \leqq v$ [km/hour], and the gain characteristic D is used when the vehicle speed v is v=0 [km/hour], where a and b represent positive real numbers, and a=40, b=60, for example. The gain characteristic E is used when the vehicle speed change Δav is smaller than a given value (e.g., Δav=0), and is used in combination with the gain characteristics A through D.

The gain characteristic A serves as a reference gain characteristic. The gain characteristic B represents a gain characteristic whose maximum value is 3.5 dB greater than the maximum value of the gain characteristic A. The gain characteristic C represents a gain characteristic whose maximum value is 6.0 dB greater than the maximum value of the gain characteristic A. The gain characteristic D represents a gain characteristic whose values are uniformly 10 dB smaller than the gain characteristic A. The gain characteristic E represents a gain characteristic whose maximum value is 6 dB smaller than the maximum value of the gain characteristic A. The gain characteristics B, C, E have respective minimum values equal to the minimum value of the gain characteristic A.

The fourth acoustic adjuster 54 selects one of the gain characteristics A through D based on the vehicle speed v, and determine whether it needs to use the gain characteristic E or not based on the vehicle speed change Δav.

The vehicle speed v is detected by the vehicle speed sensor 30 of the ECU 121, which outputs the vehicle speed signal Sv representing the vehicle speed v to the fourth acoustic adjuster 54. The data of the gain characteristics A through E are stored in a memory, not shown.

When the fourth acoustic adjuster 54 switches between the gain characteristics, it performs a fade-out process on the gain characteristic to be switched off, and performs a fade-in process on the gain characteristic which is switched on.

When the fourth acoustic adjuster 54 switches between the gain characteristics, it may switch them according to a hysteretic property. For example, when the fourth acoustic adjuster 54 switches from the gain characteristic A to the gain characteristic B, it does not switch to the gain characteristic B immediately when the vehicle speed v exceeds a [km/hour], but switches to the gain characteristic B when the vehicle speed v reaches a+5 [km/hour]. When the fourth acoustic adjuster 54 switches from the gain characteristic B to the gain characteristic A, it does not switch to the gain characteristic A immediately when the vehicle speed v becomes equal to or lower than a [km/hour], but switches to the gain characteristic A when the vehicle speed v reaches a−5 [km/hour].

The vehicle speed v based on which to switch between the gain characteristics may be varied depending on the engine rotational frequency fe. For example, if the engine rotational frequency fe is equal to or higher than a given value (e.g., 80 Hz), then the fourth acoustic adjuster 54 may switch from the gain characteristic A to the gain characteristic B at the time the vehicle speed v is a+3 km/hour. If the engine rotational frequency fe is lower than another given value (e.g., 20 Hz), then the fourth acoustic adjuster 54 may switch from the gain characteristic A to the gain characteristic B at the time the vehicle speed v is a−3 km/hour.

Figure 6:
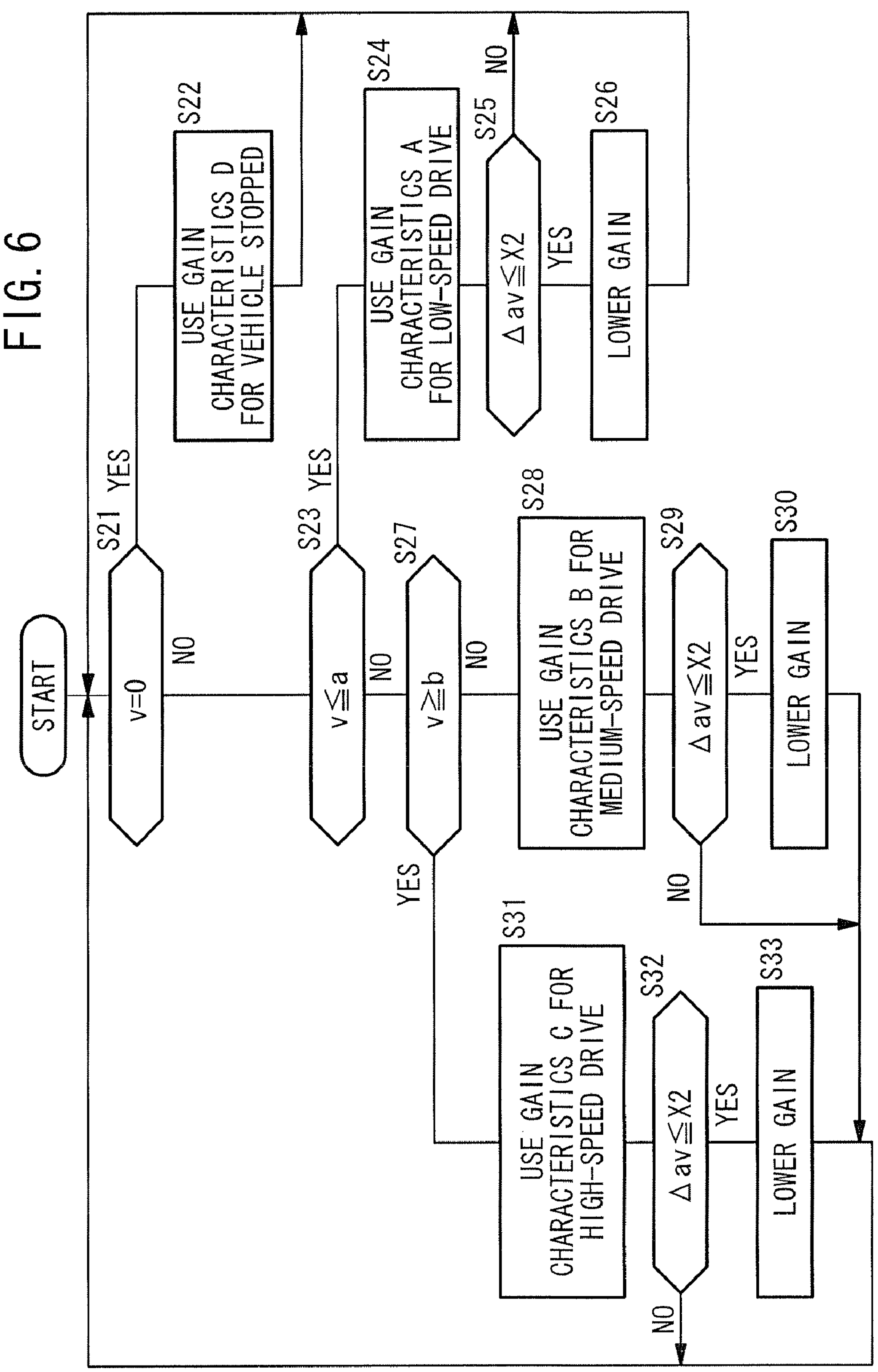
FIG. 6 is a flowchart of a sequence of the per-rotational-frequency-change adjusting process according to the first embodiment.

(iii) Sequence of the Per-Δaf Adjusting Process:

FIG. 6 is a flowchart of a sequence of the per-Δaf adjusting process.

As shown in FIG. 6, when a battery, not shown, is connected to the ECU 121, the fourth acoustic adjuster 54 (the controller 201) determines whether the vehicle speed v is 0 km/hour or not, i.e., whether the vehicle is running or not, based on the vehicle speed signal Sv from the vehicle speed sensor 30, in step S21. If the vehicle speed v is 0 km/hour, then the fourth acoustic adjuster 54 judges that the vehicle is at rest, and performs the per-Δaf adjusting process using the gain characteristic D shown in FIG. 5 in step S22.

If the vehicle speed v is not 0 km/hour in step S21, then the fourth acoustic adjuster 54 determines whether or not the vehicle speed v is a km/hour or lower (v≦a) in step S23. If v≦a, then the fourth acoustic adjuster 54 judges that the vehicle is running at a low speed, and perform the per-Δaf adjusting process using the gain characteristic A shown in FIG. 5 in step S24.

In step S25, the fourth acoustic adjuster 54 determines whether or not the vehicle speed change Δav [km/hour/second] is of a given value X2 (e.g., X2=5) or smaller. If the vehicle speed change Δav is not of the given value X2 or smaller, then the fourth acoustic adjuster 54 uses the gain characteristic A as it is. If the vehicle speed change Δav is of the given value X2 or smaller, then the fourth acoustic adjuster 54 lowers the gain characteristic A by 6 dB (or adds the gain characteristic E) in step S26.

If the vehicle speed v is higher than a km/hour in step S23, then the fourth acoustic adjuster 54 determines whether or not the vehicle speed v is b km/hour or higher in step S27. If the vehicle speed v is lower than b km/hour, then the fourth acoustic adjuster 54 judges that the vehicle is running at a medium speed, and performs the per-Δaf adjusting process using the gain characteristic B shown in FIG. 5 in step S28.

In step S29, the fourth acoustic adjuster 54 determines whether or not the vehicle speed change Δav is of the given value X2 or smaller. If the vehicle speed change Δav is not of the given value X2 or smaller, then the fourth acoustic adjuster 54 uses the gain characteristic B as it is. If the vehicle speed change Δav is of the given value X2 or smaller, then the fourth acoustic adjuster 54 lowers the gain characteristic B by 6 dB in step S30.

If the vehicle speed v is equal to or higher than b km/hour in step S27, then the fourth acoustic adjuster 54 judges that the vehicle is running at a high speed, and performs the per-Δaf adjusting process using the gain characteristic C shown in FIG. 5 in step S31.

In step S32, the fourth acoustic adjuster 54 determines whether or not the vehicle speed change Δav [km/hour/second] is of the given value X2 or smaller. If the vehicle speed change Δav is not of the given value X2 or smaller, then the fourth acoustic adjuster 54 uses the gain characteristic C as it is. If the vehicle speed change Δav is of the given value X2 or smaller, then the fourth acoustic adjuster 54 lowers the gain characteristic C by 6 dB in step S33.

After having specified the gain characteristic in step S22, S25, S26, S29, S30, S32 or S33, the fourth acoustic adjuster 54 goes back to step S21. The fourth acoustic adjuster 54 repeats steps S21 through S33 until the engine on the vehicle is shut off.

(c) Per-Engine-Load Adjusting Process:

(i) Details of the Per-Engine-Load Adjusting Process:

The per-engine-load adjusting process varies an amplitude adjusting characteristic (gain y3 [times]) for the intermediate signal Si5 output from the fourth acoustic adjuster 54 (see FIG. 1), based on the load on the engine to adjust the sound pressure level of a sound effect output from the speaker 14. The gain y3 is adjusted depending on the drive mode DM of the vehicle.

In the present embodiment, the engine load is determined using the accelerator opening Aor [%] detected by the accelerator opening sensor 60. The accelerator opening Aor is used as substantially representing the engine load. The accelerator opening sensor 60 sends an accelerator opening signal So which represents the detected accelerator opening Aor to the fifth acoustic adjuster 55.

The accelerator opening Aor indicates the ratio of the angle at the present accelerator position to the entire angle from the initial accelerator pedal position to the maximally depressed accelerator pedal position. For example, if the entire angle from the initial accelerator pedal position to the maximally depressed accelerator pedal position is 50 degrees, then the accelerator opening Aor at the initial accelerator pedal position is 0%, the accelerator opening Aor at the position where the accelerator pedal is depressed 25 degrees is 50%, and the accelerator opening Aor the maximally depressed accelerator pedal position is 100%.

The drive mode DM of the vehicle is detected by the drive mode detecting means 40, which sends a drive mode signal Sm representing the detected drive mode DM to the fifth acoustic adjuster 55. The drive mode detecting means 40 has a sports drive mode setting switch 42 for setting a sports drive mode and a cruise drive mode setting switch 44 for setting a cruise drive mode. Because of the sports drive mode setting switch 42 and the cruise drive mode setting switch 44, the ASC apparatus 101 employs three drive modes including the sports drive mode, the cruise drive mode, and a normal drive mode as an initial setting which is neither the sports drive mode nor the cruise drive mode.

The sports drive mode is a drive mode for enabling the vehicle to be driven in a sporty fashion. In the sports drive mode, the damping capability of dampers, not shown, of the vehicle is set to a higher level than in the normal drive mode. If the vehicle incorporates an automatic transmission such as a toque-converter automatic transmission, a CVT, or the like, then the engine rotational speeds at which the automatic transmission shifts up the gear positions may be set to higher values than in the normal drive mode.

The cruise drive mode is a drive mode for enabling the vehicle to assist the driver in automatically keeping a constant vehicle speed. In the cruise drive mode, the damping capability of the dampers of the vehicle is set to a lower level than in the normal drive mode.

The sports drive mode setting switch 42 and the cruise drive mode setting switch 44 may be mounted on a side of the steering wheel, not shown, of the vehicle. Alternatively, the positions that can be selected by the select lever of the transmission may include a position for setting the sports drive mode and the cruise drive mode, and the selector lever may function as the sports drive mode setting switch 42 or the cruise drive mode setting switch 44 by selecting such a position.

As shown in FIGS. 5 and 7, the per-engine-load adjusting process according to the present embodiment determines the gain y3 depending on the accelerator opening Aor representative of the engine load and the drive mode DM of the vehicle. When the drive mode DM is the normal drive mode, the fifth acoustic adjuster 55 uses a normal drive mode gain characteristic 75. According to the normal drive mode gain characteristic 75, the gain y3 increases as the accelerator opening Aor increases until the accelerator opening Aor reaches 65%, and the gain y3 reaches a maximum value (y3=1 [time]) when the accelerator opening Aor is 65% or greater. When the drive mode DM is the sports drive mode, the fifth acoustic adjuster 55 uses a sports drive mode gain characteristic 76. According to the sports drive mode gain characteristic 76, the gain y3 increases as the accelerator opening Aor increases until the accelerator opening Aor reaches 45%, and the gain y3 reaches the maximum value (y3=1 [time]) when the accelerator opening Aor is 45% or greater. When the accelerator opening Aor is in the range from 0% to 60%, the gain y3 in the sports drive mode is greater than the gain y3 in the normal drive mode.

When the drive mode DM is the cruise drive mode, the gain y3 is secured to 0.

Figure 8A:
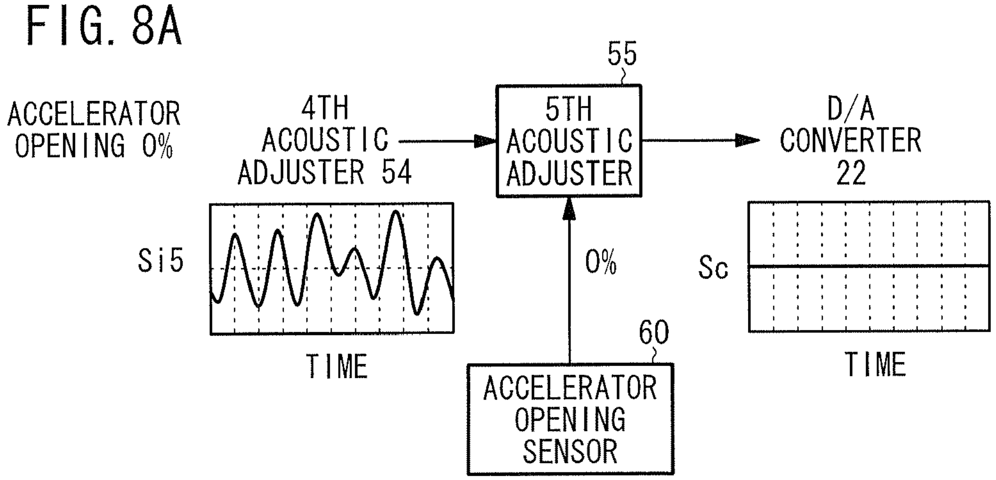
FIG. 8A is a diagram illustrative of the per-engine-load adjusting process at the time an accelerator opening is 0%.

FIG. 8A illustrates the per-engine-load adjusting process at the time the accelerator opening Aor is 0% in the normal drive mode. Since the gain y3 is set to 0 when the accelerator opening Aor is 0% (see FIG. 7), the amplitude of the control signal Sc processed by the per-engine-load adjusting process is nil.

Figure 8B:
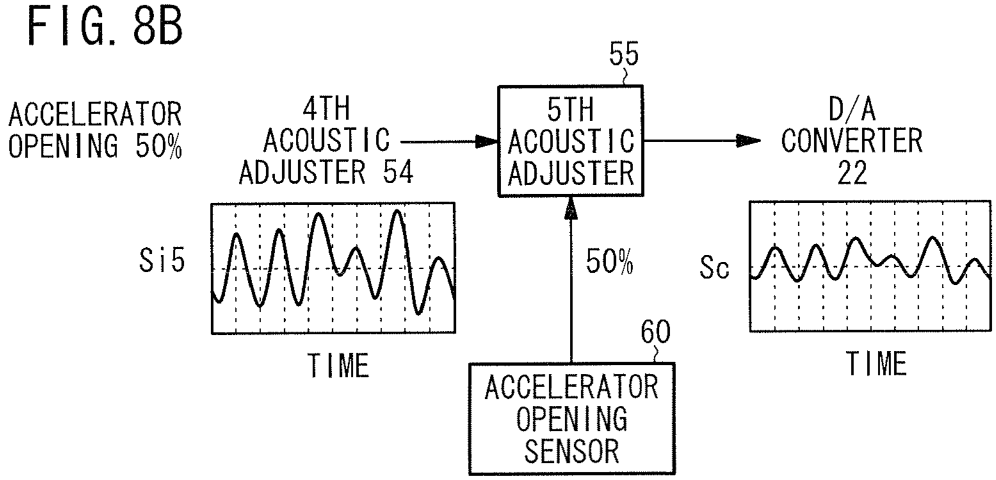
FIG. 8B is a diagram illustrative of the per-engine-load adjusting process at the time an accelerator opening is 50%.

FIG. 8B illustrates the per-engine-load adjusting process at the time the accelerator opening Aor is 50% in the normal drive mode. Since the gain y3 is set to 0.38 when the accelerator opening Aor is 50% (see FIG. 7), the amplitude of the control signal Sc processed by the per-engine-load adjusting process is 0.38 times the amplitude of the intermediate signal Si5 to be processed by the per-engine-load adjusting process.

Figure 8C:
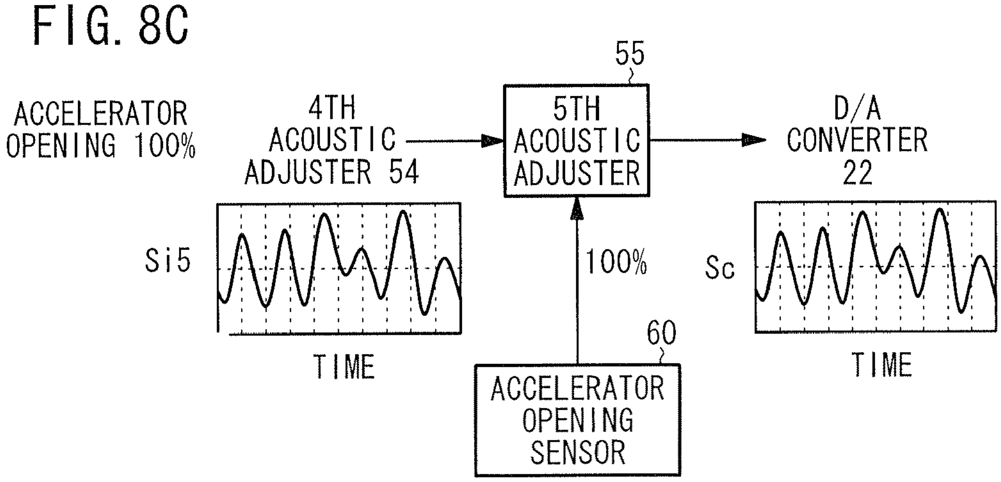
FIG. 8C is a diagram illustrative of the per-engine-load adjusting process at the time an accelerator opening is 100%.

FIG. 8C illustrates the per-engine-load adjusting process at the time the accelerator opening Aor is 100% in the normal drive mode. Since the gain y3 is set to 1 when the accelerator opening Aor is 100% (see FIG. 7), the amplitude of the control signal Sc processed by the per-engine-load adjusting process is the same as the amplitude of the intermediate signal Si5 to be processed by the per-engine-load adjusting process.

The gain characteristics 75, 76 may be varied depending on whether an accelerator opening change ΔAor [%/second], which represents a change in the accelerator opening Aor per unit time, is positive or negative. Specifically, even at the same accelerator opening Aor, the gain y3 at the time the accelerator opening change ΔAor is positive may be greater than the gain y3 at the time the accelerator opening change ΔAor is negative. For example, when the accelerator opening change ΔAor is negative, the gain characteristics 75, 76 may have their numerical values reduced 0.2 times as the gain y3.

Figure 9:
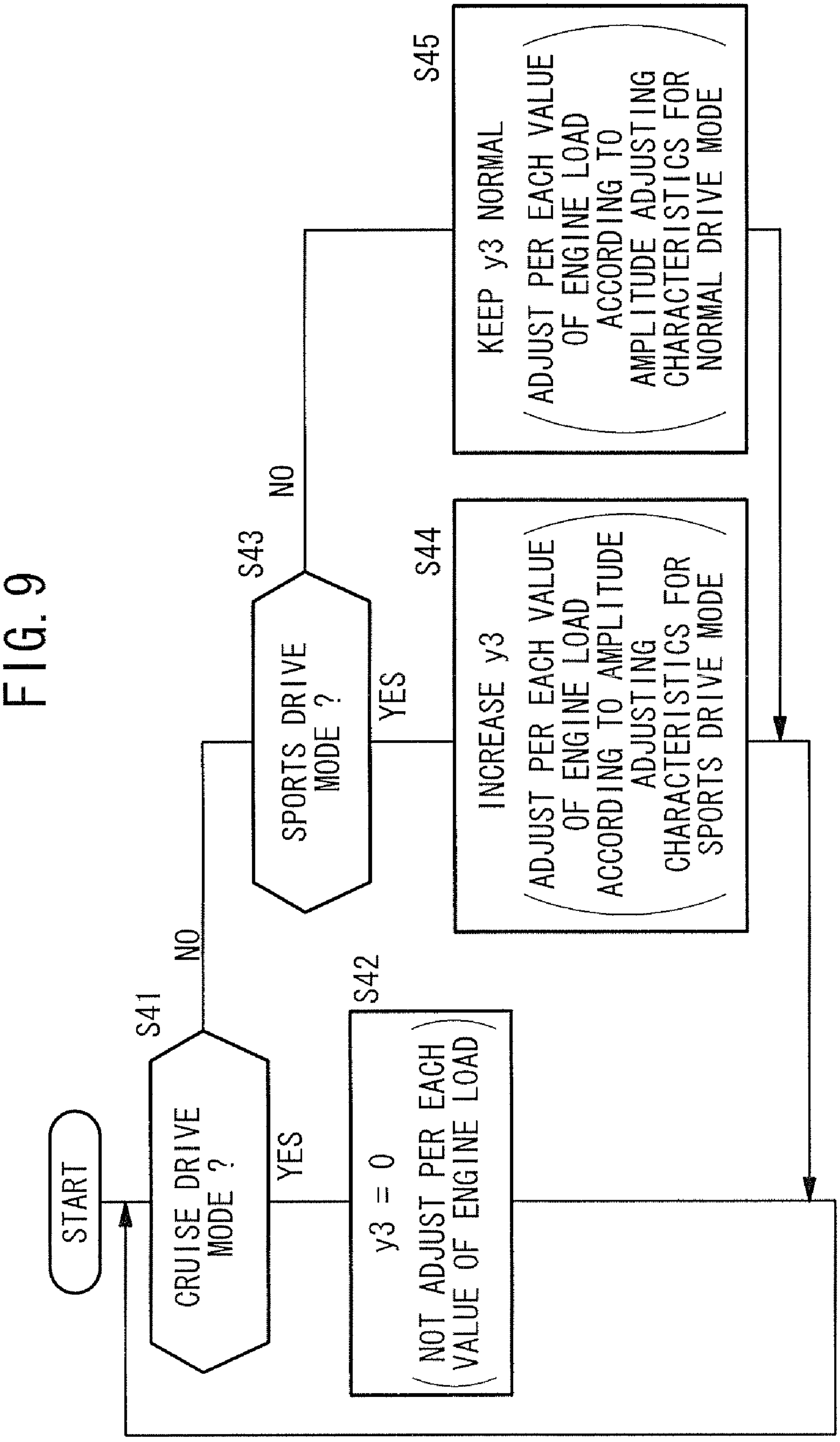
FIG. 9 is a flowchart of a sequence of the per-engine-load adjusting process according to the first embodiment.

(ii) Sequence of the Per-engine-load Adjusting Process:

FIG. 9 is a flowchart of a sequence of the per-engine-load adjusting process to determine the gain characteristics according to the first embodiment.

As shown in FIG. 9, when the ASC apparatus 101 starts to operate, the fifth acoustic adjuster 55 (the controller 201) determines whether the drive mode DM is the cruise drive mode or not based on the drive mode signal Sm from the drive mode detecting means 40 (the cruise drive mode setting switch 44) in step S41. If the drive mode DM is the cruise drive mode, the fifth acoustic adjuster 55 sets the gain y3 to 0 and does not adjust the gain y3 based on the engine load in step S42.

If the drive mode DM is not the cruise drive mode in step S41, then the fifth acoustic adjuster 55 determines whether the drive mode DM is the sports drive mode or not based on the drive mode signal Sm from the drive mode detecting means 40 (the sports drive mode setting switch 42) in step S43. If the drive mode DM is the sports drive mode, the fifth acoustic adjuster 55 performs the per-engine-load adjusting process using the sports drive mode gain characteristic 76 in step S44. If the drive mode DM is not the sports drive mode, the fifth acoustic adjuster 55 performs the per-engine-load adjusting process using the normal drive mode gain characteristic 75 in step S45.

After having specified the gain y3 in step S42, S44, or S45, the fifth acoustic adjuster 55 returns to step S41. Steps S41 through S45 are repeated until the ASC apparatus 101 is shut off.

5. Advantages of the First Embodiment:

According to the first embodiment, as described above, the controller 201 (the fourth acoustic adjuster 54 and the fifth acoustic adjuster 55) determines the amplitude of the control signal Sc by adjusting the amplitudes of the reference signals Sr1, Sr2, Sr3 (the intermediate signals Si4, Si5) depending on the engine rotational frequency change Δaf and the accelerator opening Aor.

The amplitudes of the reference signals Sr1, Sr2, Sr3 (the intermediate signal Si5) are adjusted depending on the accelerator opening Aor as well as the engine rotational frequency change Δaf. The accelerator opening Aor represents a request of the driver for accelerating or decelerating the vehicle. Therefore, the ASC apparatus 101 is capable of generating a more natural sound effect which meets the request of the driver for accelerating or decelerating the vehicle.

The ASC apparatus 101 has the drive mode detecting means 40 for detecting the drive modes DM (the sports drive motor and the cruise drive mode) of the vehicle, and the controller 201 (the fifth acoustic adjuster 55) determines the amplitude of the control signal Sc by adjusting the amplitudes of the reference signals Sr1, Sr2, Sr3 (the intermediate signal Si5) depending on the drive motor DM detected by the drive mode detecting means 40. In other words, the controller 201 switches between the gain characteristics 75, 76 (FIG. 5) for the reference signals Sr1, Sr2, Sr3 (the intermediate signal Si5) depending on the accelerator opening Aor. The gain characteristics are set depending on the drive mode DM. The ASC apparatus 101 is now capable of outputting a sound effect depending on the drive mode DM to provide a more preferable acoustic effect.

The drive modes DM include the cruise drive mode for cruising the vehicle. The cruise drive mode is a drive mode for enabling the vehicle to assist the driver in automatically keeping a constant vehicle speed. In the cruise drive mode, the request of the driver for the generation of a sound effect is considered to be different from the request of the driver in the normal drive mode. Specifically, in most cruise drive modes, the driver seems to be driving the vehicle simply to move from one place to another, rather than to enjoy driving the vehicle, and hardly wants to have a sound effect produced. Accordingly, the sound effect suitable for the cruise drive mode may be generated or the sound effect may be stopped in the cruise drive mode, and hence generation of sound effect may be controlled more appropriately.

The controller 201 (the fifth acoustic adjuster 55) has the gain characteristics 75, 76 with the gain y3 preset for each value of the accelerator opening Aor, and determines the amplitude of the control signal Sc by adjusting the amplitudes of the reference signals Sr1, Sr2, Sr3 (the intermediate signal Si5) using the gain y3 in the gain characteristics 75, 76. Since the gain y3 is preset for each value of the accelerator opening Aor, the controller 201 (the fifth acoustic adjuster 55) can quickly adjust the amplitudes of the reference signals Sr1, Sr2, Sr3 (the intermediate signal Si5). Furthermore, since the degree of amplitude adjustment can be set for each value of the accelerator opening Aor, the sound pressure of the sound effect can be controlled at small intervals.

The controller 201 (the fifth acoustic adjuster 55) calculates the accelerator opening change ΔAor, and, even at the same accelerator opening Aor, makes the amplitudes of the reference signals Sr1, Sr2, Sr3 (the intermediate signal Si5) greater when the accelerator opening change ΔAor is positive than when the accelerator opening change ΔAor is negative. Generally, when the accelerator opening change ΔAor is positive, the driver wants the vehicle to be accelerated quickly, and when the accelerator opening change ΔAor is negative, the driver wants the vehicle to be decelerated or accelerated slowly. Therefore, the ASC apparatus 101 thus arranged is capable of generating a more natural sound effect.

B. Second Embodiment

Figure 10:
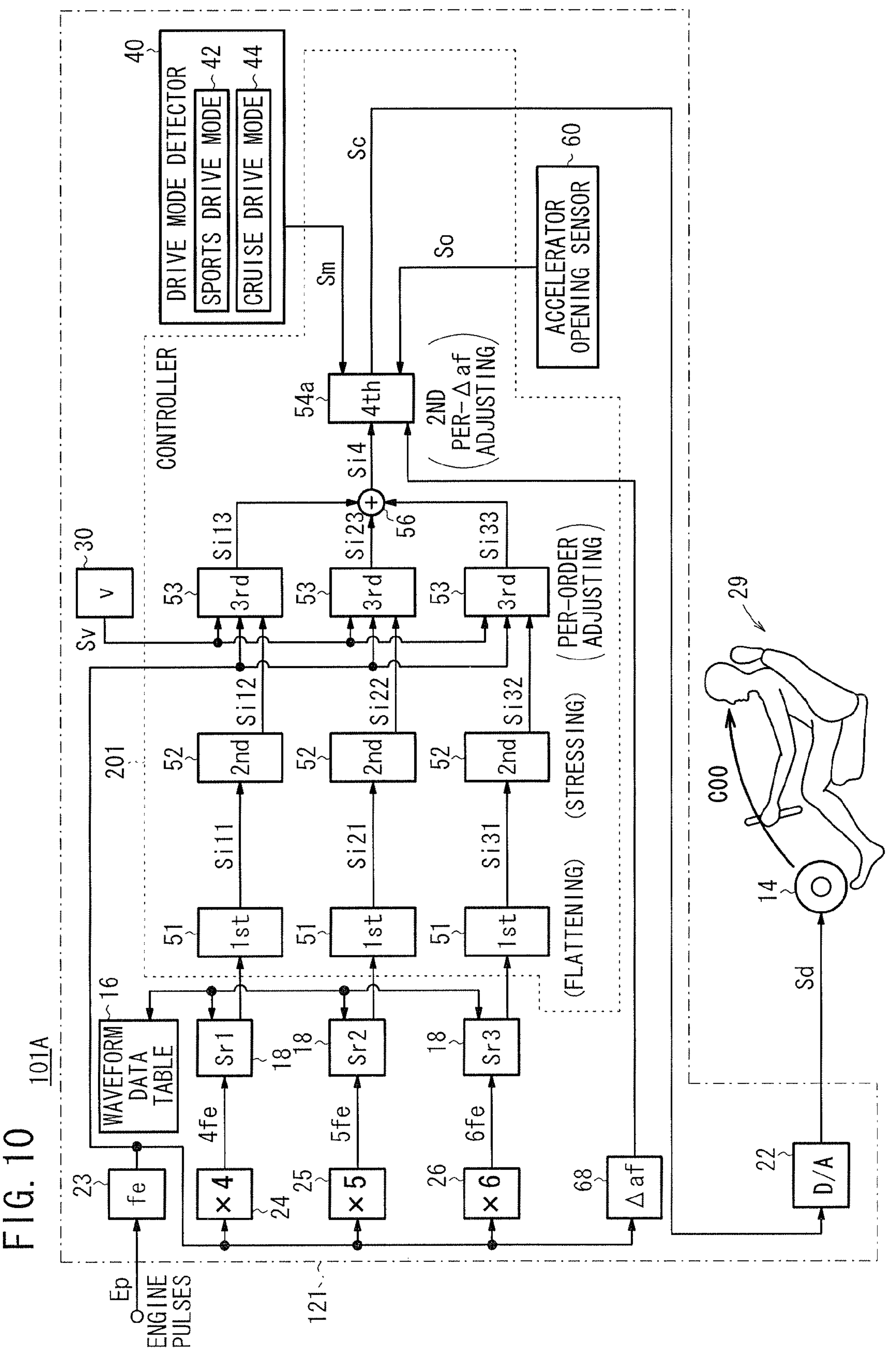
FIG. 10 is a block diagram showing a general functional configuration of an active sound effect generating apparatus according to a second embodiment of the present invention.

1. Features of the Second Embodiment (Differences with the First Embodiment):

FIG. 10 shows in block form a general functional configuration of an ASC apparatus 101A according to a second embodiment of the present invention. The ASC apparatus 101A has basically the same configuration as the ASC apparatus 101, but is different therefrom in that it has a fourth acoustic adjuster 54*a* for performing a per-rotational-frequency-change adjusting process (hereinafter referred to as "second per-Δaf adjusting process") that is different from the per-rotational-frequency-change adjusting process (the per-Δaf adjusting process) according to the first embodiment. In the ASC apparatus 101A according to the second embodiment, the accelerator opening sensor 60 sends the accelerator opening signal So to the fourth acoustic adjuster 54*a*, and the drive mode detecting means 40 sends the drive mode signal Sm to the fourth acoustic adjuster 54*a*. The vehicle speed sensor 30 does not send the vehicle speed signal v to the fourth acoustic adjuster 54*a*.

2. Second Per-Δaf Adjusting Process:

(i) Details of the Second Per-Δaf Adjusting Process:

As with the per-Δaf adjusting process according to the first embodiment, the second per-Δaf adjusting process varies a gain Y2' [dB] for amplifying the intermediate signal Si4, which the adder 56 generates by combining the intermediate signals Si13, Si23, Si33 (FIG. 10) output from the third acoustic adjuster 53, based on the engine rotational frequency change Δaf to adjust the sound pressure level of a sound effect output from the speaker 14.

Figure 11:
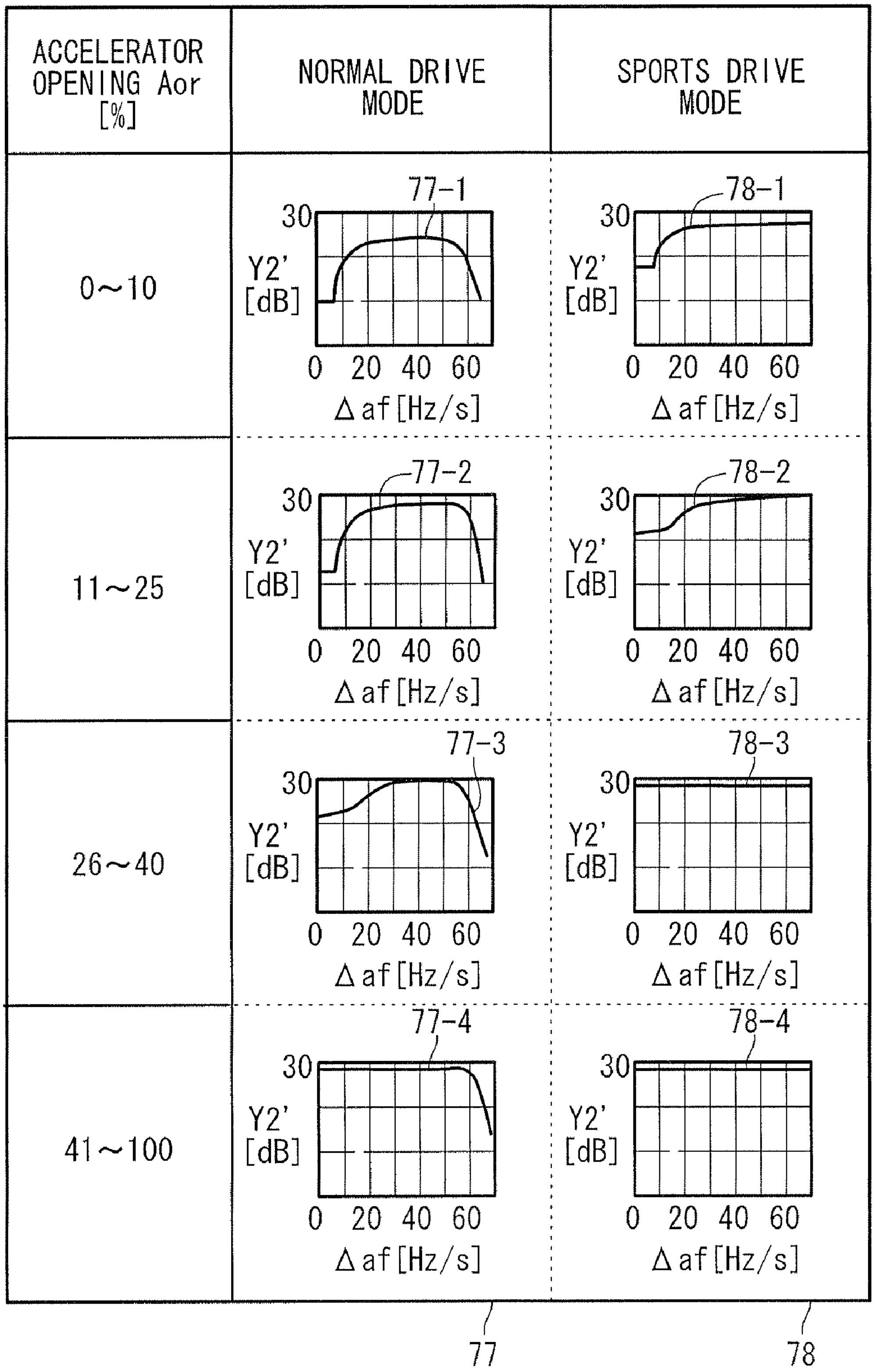
FIG. 11 is a diagram showing gain characteristics used in a second per-rotational-frequency-change adjusting process according to the second embodiment.

However, the fourth acoustic adjuster 54*a* does not switch between the gain characteristics based on the vehicle speed v and the vehicle speed change Δav as shown in FIGS. 2 and 5, but switches between the gain characteristics depending on the accelerator opening Aor and the drive mode DM (the normal drive mode and the sports drive mode). Specifically, as shown in FIG. 11, the accelerator opening Aor is divided into four zones (0%-10%, 11%-25%, 26%-40%, 41%-100%), and gain characteristics 77-1 to 77-4, 78-1 to 78-4 are set in those four zones to adjust the gain depending on the engine rotational frequency change Δaf. The zones of the accelerator opening Aor are not limited four zones, but may be varied depending on the specifications of the ASC apparatus 101A.

As shown in FIG. 11, the gain characteristics 77-1 to 77-4, 78-1 to 78-4 used in the second per-Δaf adjusting process are not simple combinations of the gain characteristic 74 (FIG. 4) in the fourth acoustic adjuster 54 and the gain characteristics 75, 76 (FIG. 7) in the fifth acoustic adjuster 55 according to the first embodiment, but have their gain Y2' set more flexibly based on the relationship between the engine rotational frequency change Δaf and the accelerator opening Aor.

After having performed the second per-Δaf adjusting process on the intermediate signal Si4, the fourth acoustic adjuster 54*a* sends the control signal Sc to the D/A converter 22.

Figure 12:
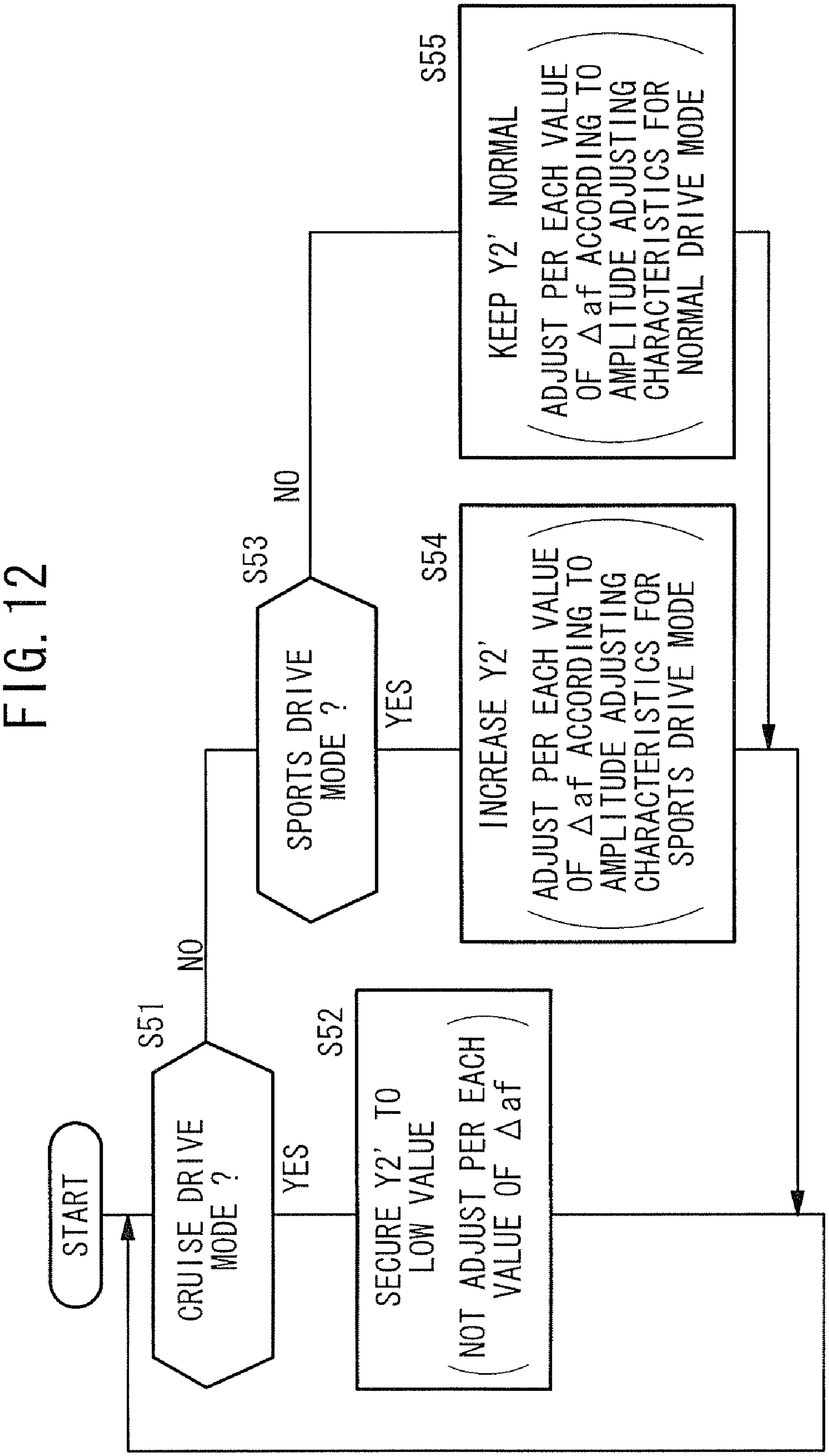
FIG. 12 is a flowchart of a sequence of the second per-rotational-frequency-change adjusting process according to the second embodiment.

(ii) Sequence of the Second Per-Δaf Adjusting Process:

FIG. 12 is a flowchart of a sequence of the second per-Δaf adjusting process.

As shown in FIG. 12, when the ASC apparatus 101A starts to operate, the fourth acoustic adjuster 54 (the controller 201) determines whether the drive mode DM is the cruise drive mode or not based on the drive mode signal Sm from the drive mode detecting means 40 (the cruise drive mode setting switch 44) in step S51. If the drive mode DM is the cruise drive mode, the fourth acoustic adjuster 54*a* sets the gain Y2' to a low value (e.g., 0 dB) and does not adjust the gain Y2' based on the accelerator opening Aor in step S52.

If the drive mode DM is not the cruise drive mode in step S51, then the fourth acoustic adjuster 54 determines whether the drive mode DM is the sports drive mode or not based on the drive mode signal Sm from the drive mode detecting means 40 (the sports drive mode setting switch 42) in step S53. If the drive mode DM is the sports drive mode, the fourth acoustic adjuster 54*a* performs the per-engine-load adjusting process using the sports drive mode gain characteristics 77 (FIG. 11) in step S54. If the drive mode DM is not the sports drive mode, the fourth acoustic adjuster 54*a* performs the per-engine-load adjusting process using the normal drive mode gain characteristics 78 in step S55.

After having specified the gain Y2' in step S52, S54, or S55, the fourth acoustic adjuster 54*a* returns to step S51. Steps S51 through S55 are repeated until the ASC apparatus 101A is shut off.

3. Advantages of the Second Embodiment:

The ASC apparatus 101A according to the second embodiment offers, in addition to the advantages of the first embodiment, the following advantages: The controller 201 (the fourth acoustic adjuster 54*a*) switches between the gain characteristics 77, 78 for the reference signals Sr1, Sr2, Sr3 (the intermediate signal Si4) based on the engine rotational frequency change Δaf depending on the accelerator opening Aor. In this manner, amplitude adjusting characteristics for the reference signals Sr1, Sr2, Sr3 can be set more flexibly than if amplitude adjusting characteristics for the reference signals Sr1, Sr2, Sr3 based on the engine rotational frequency change Δaf and amplitude adjusting characteristics for the reference signals Sr1, Sr2, Sr3 based on the accelerator opening Aor are set independently of each other.

C. Applications of the Invention:

The present invention is not limited to the above embodiments, but various changes and modifications may be made thereto based on the description of the invention. For example, the invention covers changes and modifications described below in 1 through 9:

1. Mobile Body:

In the above embodiments, the ASC apparatus 101, 101A are mounted on an automatic transmission vehicle. However, the ASC apparatus 101, 101A are mounted on a manual transmission vehicle. The ASC apparatus 101, 101A may be incorporated in other mobile bodies than the vehicles if they are capable of generating a sound effect based on the engine rotational frequency change Δaf. For example, the ASC apparatus 101, 101A may be incorporated in helicopters, air planes, pleasure boats, etc.

2. The Number of Reference Signals and Components:

In the above embodiments, the three reference signals Sr1, Sr2, Sr3 are employed. However, the number of reference signals is arbitrary and may be set depending on the specifications of the ASC apparatus 101, 101A. The numbers of other components (the multipliers, the reference signal generators, etc.) may be varied depending on the number of reference signals required.

In the above embodiments, the number of multipliers 24, 25, 26, the number of reference signal generators 18, etc. are the same as the number of reference signals Sr1, Sr2, Sr3, i.e., three. However, the reference signals Sr1, Sr2, Sr3 may be processed by one or two components.

3. Amplitude Adjusting Characteristics:

In the first embodiment, the amplitude adjusting characteristics for use in the per-Δaf adjusting process represent the gain Y2 [dB], and the amplitude adjusting characteristics for use in the per-engine-load adjusting process represent the gain y3 [times]. However, other amplitude adjusting characteristics may be employed. For example, the amplitude adjusting characteristics for use in the per-Δaf adjusting process represent a gain [times], and the amplitude adjusting characteristics for use in the per-engine-load adjusting process represent a gain [dB]. The same holds true for the gain Y2' for use in the second per-Δaf adjusting process according to the second embodiment.

4. Detection of the Vehicle Speed v:

In the above embodiment, the vehicle speed sensor 30 is used to detect the vehicle speed v. However, anything else capable of detecting the vehicle speed v may be used. For example, the vehicle speed v may be detected from countershaft pulses, main shaft pulses, or propeller shaft pulses. Alternatively, the position of the vehicle may be detected by a GPS, and the vehicle speed v may be calculated from the distance traveled per unit time by the vehicle as detected by the GPS.

5. Determination of the Vehicle Speed Change Δav:

In the above embodiment, for determining the vehicle speed change Δav, the vehicle speed change Δav is calculated from the vehicle speed v detected by the vehicle speed sensor 30. However, anything else capable of determining the vehicle speed change Δav may be used. For example, the vehicle may have an accelerator sensor for directly detecting the vehicle speed change Δav. Furthermore, the vehicle speed change Δav may be determined from countershaft pulses, main shaft pulses, or propeller shaft pulses. Alternatively, the position of the vehicle may be detected by a GPS, and the vehicle speed change Δav may be calculated from the distance traveled per unit time by the vehicle as detected by the GPS.

6. Engine Load:

In the above embodiments, the accelerator opening Aor is used as representing the engine load. However, anything else representing the engine load may be used. For example, the throttle opening, the engine torque, or the vacuum in the intake manifold may be used as representing the engine load.

Figure 13:
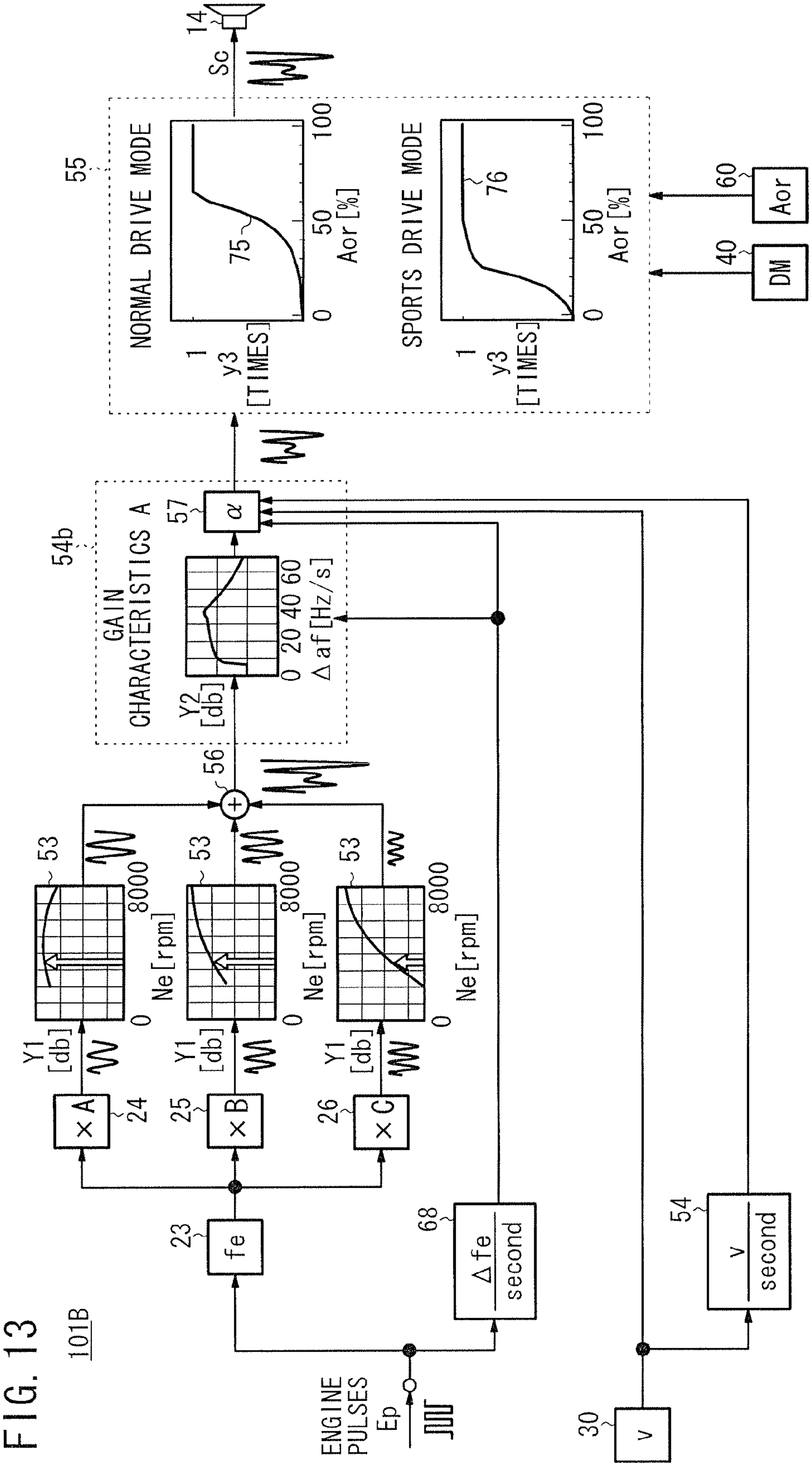
FIG. 13 is a conceptual diagram illustrative of a process of switching amplitude adjusting characteristics according to a first modification.

7. Per-Δaf Adjusting Process:

In the first embodiment, the forth acoustic adjuster 54 switches between the gain characteristics A through E depending on the vehicle speed v and the vehicle speed change Δav. However, FIG. 13 shows an ASC apparatus 101B according to a first modification which includes a fourth acoustic adjuster 54*b* having only the gain characteristic A and a gain adjusting circuit 57 instead of providing the gain characteristics B through E.

The gain adjusting circuit 57 determines a gain to be added to the gain characteristic A from the engine rotational frequency change Δaf from the engine rotational frequency change calculator 68 and the vehicle speed signal Sv from the vehicle speed sensor 30. Stated otherwise, whereas the ASC apparatus 101 according to the first embodiment selects one of the gain characteristics depending on the vehicle speed v and the vehicle speed change Δav, the ASC apparatus 101B according to the first modification has only one gain characteristic and adjust the value of the gain of the one gain characteristic depending on vehicle speed v and the vehicle speed change Δav.

Figure 14:
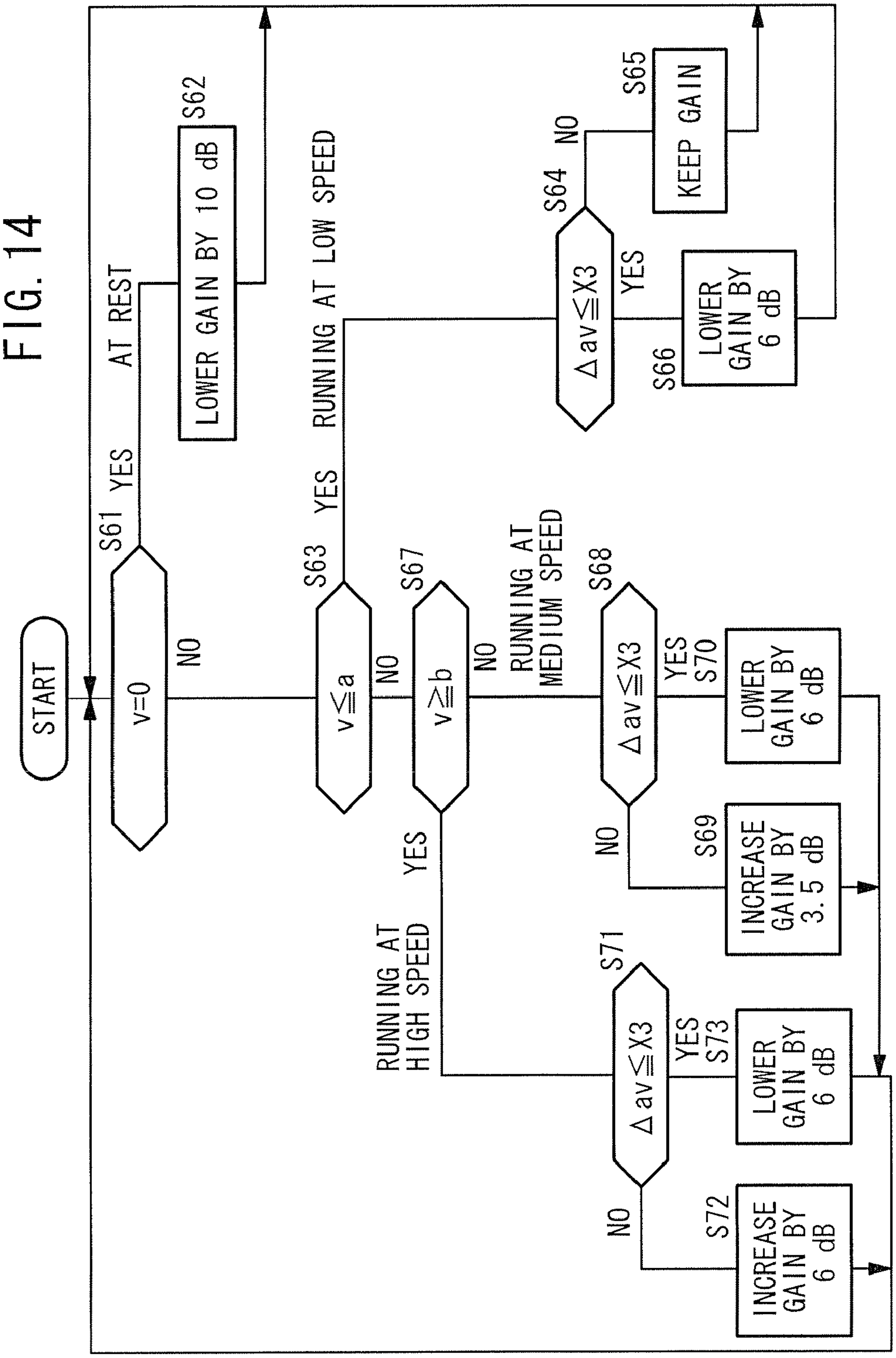
FIG. 14 is a flow chart of a sequence for switching gain characteristics in a per-rotational-frequency-change adjusting process according to the first modification.
Figure 15:
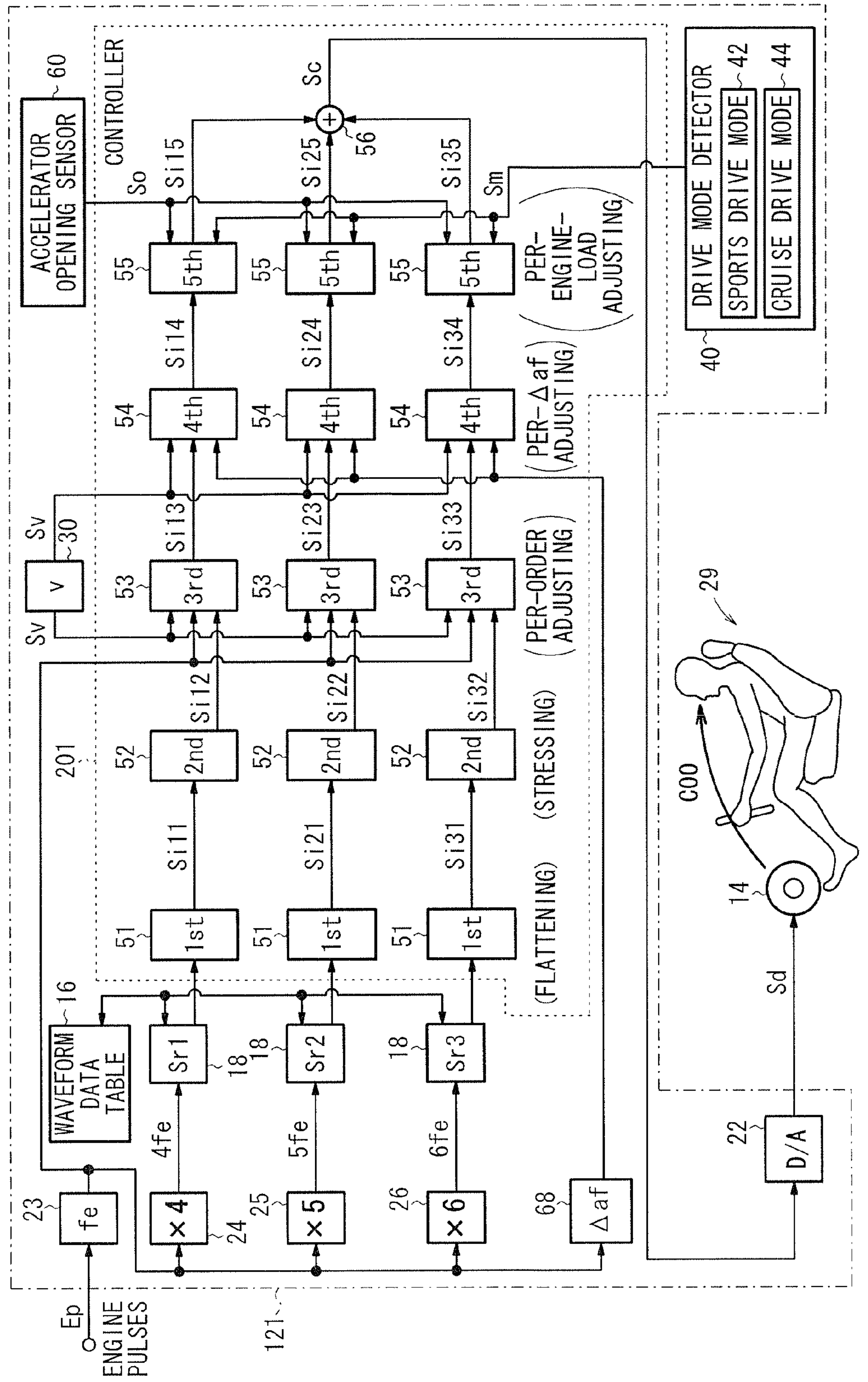
FIG. 15 is a block diagram showing a general functional configuration of an active sound effect generating apparatus according to a second modification.

FIG. 14 is a flowchart of a sequence for determining a gain with the fourth acoustic adjuster 54*b* of the ASC apparatus 101B according to the first modification.

As shown in FIG. 14, when a battery, not shown, is connected to the ECU 121, the fourth acoustic adjuster 54*b* determines whether the vehicle speed v is 0 km/hour or not, i.e., whether the vehicle is running or not, based on the vehicle speed signal Sv from the vehicle speed sensor 30, in step S61. If the vehicle speed v is 0 km/hour, then the fourth acoustic adjuster 54*b* judges that the vehicle is at rest, and reduces the value of the gain characteristic A by 10 dB in step S62.

If the vehicle speed v is not 0 km/hour in step S61, then the fourth acoustic adjusters 54*b* determines whether or not the vehicle speed v is a km/hour (e.g., a=40) or lower (v≦a) in step S63. If v≦a, then the fourth acoustic adjuster 54*b* judges that the vehicle is running at a low speed, and determines whether or not the vehicle speed change Δav [km/hour/second] is of a given value X3 (e.g., X3=5) or smaller. If the vehicle speed change Δav is not of the given value X3 or smaller, then the fourth acoustic adjuster 54*b* uses the gain characteristic A as it is in step S65. If the vehicle speed change Δav is of the given value X3 or smaller in step S64, then the fourth acoustic adjuster 54*b* lowers the value of the gain characteristic A by 6 dB in step S66.

If the vehicle speed v is higher than a km/hour in step S63, then the fourth acoustic adjuster 54*b* determines whether or not the vehicle speed v is b km/hour (e.g., b=60) or higher in step S67. If the vehicle speed v is lower than b km/hour, then the fourth acoustic adjuster 54*b* judges that the vehicle is running at a medium speed, and determines whether or not the vehicle speed change Δav is of the given value X3 or smaller in step S68. If the vehicle speed change Δav is not of the given value X3 or smaller, then the fourth acoustic adjuster 54*b* increases the values of the gain characteristic A by 3.5 dB in step S69. If the vehicle speed change Δav is of the given value X3 or smaller, then the fourth acoustic adjuster 54*b* lowers the values of the gain characteristic A by 6 dB in step S70.

If the vehicle speed v is equal to or higher than b km/hour in step S67, then the fourth acoustic adjuster 54*b* judges that the vehicle is running at a high speed, and determines whether or not the vehicle speed change Δav is of the given value X3 or smaller in step S71. If the vehicle speed change Δav is not of the given value X3 or smaller, then the fourth acoustic adjuster 54*b* increases the values of the gain characteristic A by 6 dB in step S72. If the vehicle speed change Δav is of the given value X3 or smaller, then the fourth acoustic adjuster 54*b* lowers the values of the gain characteristic A by 6 dB in step S73.

After having specified the gain characteristics in step S62, S65, S66, S69, S70, S72 or S73, the fourth acoustic adjuster 54*b* goes back to step S61. The fourth acoustic adjuster 54*b* repeats steps S61 through S73 until the engine on the vehicle is shut off.

8. Per-Engine-Load Adjusting Process and Second Per-Δaf Adjusting Process:

In the first embodiment, the gain y3 used in the per-engine-load adjusting process is changed depending on the normal drive mode, the sports drive mode, and the cruise drive mode. However, other drive modes may be employed. For example, a luxury drive mode, which is a drive mode for providing a quite cabin environment and in which the damping capability of the dampers of the vehicle is set to a lower level than in the normal drive mode, may be employed. Alternatively, if the vehicle incorporates a manual transmission which allows the driver to select manual gear shifts, and a plurality of drive modes include an automatic transmission mode (normal drive mode) in which the driver is not selecting manual gear shifts and a manual transmission mode in which the driver is selecting manual gear shifts, then the controller 201 may set gains in the manual transmission mode to values higher than gains in the automatic transmission mode.

Furthermore, the gain characteristics may not be switched depending on the drive mode DM.

In the second per-Δaf adjusting process according to the second embodiment, another drive mode may be used to switch between the gain characteristics, or the gain characteristics may not be switched depending on the drive mode DM.

In the second embodiment, the vehicle speed signal Sv from the vehicle speed sensor 30 may be input to the fourth acoustic adjuster 54*a* and may be used in the same manner as with the first embodiment. Stated otherwise, the gain characteristics used in the second per-Δaf adjusting process may be set using the vehicle speed v and the vehicle speed change Δaf in addition to the engine rotational frequency change Δaf, the accelerator opening Aor, and the drive mode DM.

9. Others:

In the first embodiment, the fourth acoustic adjuster 54 and the fifth acoustic adjuster 55 are disposed downstream of the adder 56. However, the fourth acoustic adjuster 54 and the fifth acoustic adjuster 55 may be disposed upstream of the adder 56. For example, in an ASC apparatus 101C according to a second modification, the fourth acoustic adjusters 54 and the fifth acoustic adjusters 55 are disposed between the third acoustic adjusters 53 and the adder 56. The fourth acoustic adjusters 54 perform the per-Δaf adjusting process on the respective intermediate signals Si13, Si23, Si33 from the third acoustic adjusters 53, and output respective intermediate signals Si14, Si24, Si34. The fifth acoustic adjusters 55 perform the per-engine-load adjusting process on the respective intermediate signals Si14, Si24, Si34 from the fourth acoustic adjusters 54, and output respective intermediate signals Si15, Si25, Si35. The gain characteristics should preferably be changed depending on the orders of the reference signals Sr1, Sr2, Sr3. Thus, the gain characteristics can be adjusted per order for more detailed control of the sound effect.

In the above embodiments, the first acoustic adjusters 51 perform the sound field adjusting process, the second acoustic adjusters 52 perform the frequency stressing process, and the third acoustic adjusters 53 perform the per-order adjusting process. However, the sound field adjusting process, the frequency stressing process, and the per-order adjusting process may not be performed depending on a gain characteristic C00 in the passenger's position 29 and the required specifications. In other words, the per-Δaf adjusting process, the per-engine-load adjusting process, or the second per-Δaf adjusting process may be performed directly on the reference signals Sr1, Sr2, Sr3. In the first embodiment, either the fourth acoustic adjuster 54 or the fifth acoustic adjuster 55 may be dispensed with.

Although certain preferred embodiments of the present invention have been shown and described in detail, it should be understood that various changes and modifications may be made therein without departing from the scope of the appended claims.

What is claimed is:

1. An active sound effect generating apparatus comprising:
- a waveform data table for storing one period of waveform data;
- a rotational frequency detector for detecting the rotational frequency of an engine;
- a reference signal generator for generating a harmonic reference signal based on said rotational frequency by reading said waveform data successively from said waveform data table;
- a controller for generating a control signal to generate a sound effect based on said reference signal;
- an output unit for outputting said sound effect based on said control signal;
- a rotational frequency change calculator for calculating a rotational frequency change which represents a change per unit time in said rotational frequency; and
- an engine load detector for detecting a load on the engine;
- wherein said controller determines an amplitude of said control signal by adjusting an amplitude of said reference signal depending on said rotational frequency change and said load on the engine.

2. An active sound effect generating apparatus according to claim 1, wherein said engine load detector detects an accelerator opening as representing the load on the engine.

3. An active sound effect generating apparatus according to claim 1, further comprising:
- a drive mode detector for detecting drive modes of a vehicle;
- wherein said controller determines the amplitude of said control signal by adjusting the amplitude of said reference signal depending on the drive mode detected by said drive mode detector.

4. An active sound effect generating apparatus according to claim 3, wherein said controller switches between amplitude adjusting characteristics for said reference signal depending on said drive mode, said amplitude adjusting characteristics being set depending on the load on the engine.

5. An active sound effect generating apparatus according to claim 3, wherein said drive modes include a cruise drive mode for enabling said vehicle to cruise.

6. An active sound effect generating apparatus according to claim 1, wherein said controller has amplitude adjusting characteristics with weighted values preset for each value of the load on the engine, and determines the amplitude of said control signal by adjusting the amplitude of said reference signal using said weighted values.

7. An active sound effect generating apparatus according to claim 1, wherein said controller switches between amplitude adjusting characteristics for said reference signal depending on the load on the engine, said amplitude adjusting characteristics being set depending on said rotational frequency change.

8. An active sound effect generating apparatus according to claim 1, wherein said controller calculates an engine load change which represents a change per unit time in the load on the engine, and makes the amplitude of said control signal greater when said engine load change is positive than when said engine load change is negative.

* * * * *